United States Patent
Nakayama et al.

(10) Patent No.: US 6,590,917 B2
(45) Date of Patent: *Jul. 8, 2003

(54) SURFACE EMITTING LASER AND SURFACE EMITTING LASER ARRAY

(75) Inventors: Hideo Nakayama, Nakai-machi (JP);
Akira Sakamoto, Nakai-machi (JP);
Takeshi Nakamura, Nakai-machi (JP);
Fumio Koyama, Yokohama (JP)

(73) Assignee: Fuji Xerox Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/321,711

(22) Filed: May 28, 1999

(65) Prior Publication Data

US 2002/0006143 A1 Jan. 17, 2002

(30) Foreign Application Priority Data

Jul. 6, 1998 (JP) .......................... 10-190701

(51) Int. Cl.$^7$ ................................. H01S 5/20
(52) U.S. Cl. ........................................ 372/45
(58) Field of Search ...................... 372/45, 46, 95, 372/96, 92, 98

(56) References Cited

U.S. PATENT DOCUMENTS

| | | | | | |
|---|---|---|---|---|---|
| 5,115,441 | A | * | 5/1992 | Kopf et al. | 372/45 |
| 5,115,442 | A | * | 5/1992 | Lee et al. | |
| 5,493,577 | A | * | 2/1996 | Choquette et al. | 372/46 |
| 5,753,941 | A | | 5/1998 | Shin et al. | 257/98 |
| 5,838,715 | A | | 11/1998 | Corzine et al. | 372/96 |
| 5,879,961 | A | * | 3/1999 | Scott | 438/32 |
| 5,903,590 | A | * | 5/1999 | Hadley et al. | 372/96 |
| 5,940,422 | A | * | 8/1999 | Johnson | 372/45 |

FOREIGN PATENT DOCUMENTS

| JP | A-5-3370 | 1/1993 |
|---|---|---|
| JP | A-10-56233 | 2/1998 |

OTHER PUBLICATIONS

K. Iga et al., *Surface Emitting Semiconductor Lasers*, IEEE Journal of Quantum Electronics, vol. 24, No. 9, pp. 1845–1855, (Sep.,1988).
R. A. Morgan et al., *Transverse Mode Control of Vertical–Cavity Top–Surface–Emitting Lasers*, IEEE Photonics Technology Letters, vol. 4, No. 4, pp. 374–377, (Apr., 1993).
G. Ronald Hadley, *Effective Index Model For Vertical–Cavity Surface–Emitting Lasers*, Optics Letters, vol. 20, No. 13, pp. 1483–1485, (Jul., 1995).
Morgan, R.A. et al.; "Hybrid Dielectric/AlSaAs Mirror Spatially Filtered Vertical Cavity Top–Surface Emitting Laser," Appl. Phys. Lett., vol. 66, No. 10, 1995, pp. 1157–1159.
K. Iga et al., "Surface Emitting Laser," Ohm–sha, 1990, pp. 168–177.

* cited by examiner

*Primary Examiner*—Paul Ip
*Assistant Examiner*—Jeffrey N Zahn
(74) *Attorney, Agent, or Firm*—Oliff & Berridge, PLC

(57) ABSTRACT

A surface emitting laser and a surface emitting laser array capable of high-luminance optical output in fundamental transverse mode, which can be produced easily with good reproducibility and with small position variation.

The surface emitting laser has an active layer region composed of an active layer and upper and lower spacer layers deposited on both sides thereof and reflection layers deposited on both sides of the active layer region, an upper reflecting layer deposited on the upper spacer layer of the active layer region, a lower reflecting layer deposited on the lower spacer layer of the active layer region, and a secondary cavity formed by a first mode control layer and a second mode control layer placed on the periphery of the region of emission of the laser beam at the upper reflecting layer.

26 Claims, 15 Drawing Sheets

$\lambda_1$ $\lambda_0$ $\lambda_1$
$n_1$ $n_0$ $n_1$

SURFACE EMITTING LASER AND SURFACE EMITTING LASER ARRAY

BACKGROUND OF THE INVENTION

1. Field of the Invention

The present invention relates to a surface emitting laser and a surface emitting laser array. More particularly, the present invention relates to a vertical cavity surface emitting laser and a surface emitting laser array with a high-luminance optical output in fundamental transverse mode.

2. Description of the Related Art

The vertical cavity surface emitting laser ("VCSEL" for short hereinafter) is expected to find use in a wide range of applications because of its many advantages over the edge emitting laser, such as lower production cost and higher yields and capability of being arranged easily in a two-dimensional array.

The structure, characteristics, and applications of VCSEL were mentioned in IEEE Journal of Quantum Electronics, 1988, 24, pp. 1845–1855, "Surface Emitting Semiconductor Lasers" by Kenichi Iga, Fumio Koyama, and Susumu Kinoshita. Since then, VCSEL has been greatly improved in characteristic properties and put to practical use in the area of optical communications.

However, the conventional VCSEL still has a small optical output in fundamental transverse mode (2–3 mW at the highest) and hence is limited in applications. If it has an increased optical output in fundamental transverse mode (say, 5 mW and above), then it will find use in the image-writing unit (such as laser beam printer) and magneto-optical disk unit.

One way to increase the optical out of VCSEL in fundamental transverse mode was described in IEEE Photonics Technology Letters, 4, pp. 374–377, 1993, "Transverse Mode Control of Vertical-Cavity Top-Surface-Emitting Lasers" by R. A. Morgan et al. According to this literature, the object is achieved if the emitting region for laser beam has an adequate opening.

This VCSEL has the general structure of proton implantation type, as shown in FIG. 16. It is composed of several layers formed on an n-type GaAs substrate (not shown). On the substrate is formed a lower n-type DBR (Distributed Bragg Reflector) layer 161 including layers of AlAs and $Al_{0.16}Ga_{0.84}As$ deposited alternately 28.5 periods, having a carrier density of $3\times10^{18}$ cm$^{-3}$. On this lower DBR layer 161 is formed an undoped active layer region 162 including an active layer of quantum well structure and a spacer layer. On this active layer region 162 is formed an upper p-type DBR layer 163 including layers of AlAs and $Al_{0.16}Ga_{0.84}As$ deposited alternately 20 periods, with $Al_{0.58}Ga_{0.42}As$ placed at interface, having a carrier density of $3\times10^{18}$~$2\times10^{19}$ cm$^{-3}$. On this upper p-type DBR layer 163 is formed a p-side electrode 164 with an opening 166 which defines the laser beam emitting region with a diameter W. The upper p-type DBR layer 163 is surrounded by a high-resistance region 165 formed by proton implantation which limits the region for current confinement into the active layer.

Incidentally, an n-side electrode (not shown) is formed on the underside of the substrate (not shown).

The VCSEL constructed as mentioned above is said to increase in the optical output in fundamental transverse mode if the size (or diameter g) of the current injection region and the opening W of the emitting region 166 are optimized. However, the optical output in fundamental transverse mode is still only 1.5 mW at the maximum. This output is too small for the laser to be used satisfactorily for the magneto-optical disk unit.

To address this problem, there has been proposed a VCSEL with a high-luminance optical output in fundamental transverse mode (Japanese Patent Laid-open H10-56233). According to this disclosure, the object of increasing the optical output in fundamental transverse mode is achieved by selectively controlling the lasing condition that permits the high-order transverse mode to occur secondarily in addition to the fundamental transverse mode. Because the fundamental transverse mode oscillation in VCSEL occurs at the center of the optical waveguide (or in the vicinity of the optical axis) and the high-order transverse mode oscillation occurs at a place away from the optical axis, it is possible to increase the optical output in fundamental transverse mode if the lasing condition is controlled such that the optical loss of the cavity gradually increases with the increasing distance from the optical axis and the injection current increases accordingly and multiple mode oscillation is suppressed.

To be more specific, the VCSEL is explained with reference to FIG. 17. It consists of a conductivity-type semiconductor substrate 171, a lower DBR layer 172, an upper DBR layer 174 whose conduction mode is opposite to that of the lower DBR layer 172, an active layer region 173 interposed between the lower DBR layer 172 and the upper DBR layer 174, a low reflectance zone 175 formed by ion implantation, a loss-determining element 176, and electrodes 177 and 178. It emits the laser beam along the optical axis 179.

The loss-determining element 176 has a concave shape so that the optical loss of the cavity gradually increases in going away from the optical axis 179 in the direction perpendicular to the optical axis 179. The concave loss-determining element 176 both diffracts the laser beam from the cavity and diffuses sideward (or defocuses) the laser beam from the cavity.

Therefore, this loss-determining element 176 causes the refraction loss to increase with the increasing distance from the optical axis 179 in the direction perpendicular to the optical axis 179, and the optical loss of the cavity increases accordingly. On the other hand, in VCSEL, the fundamental transverse mode oscillation occurs in the vicinity of the optical axis 179 and the high-order transverse mode oscillation occurs at a position away from the optical axis 179.

As the result, the optical loss of the cavity increases for the high-order transverse mode, the threshold current density necessary for the laser oscillation of high-order transverse mode to start increases, and the maximum fundamental transverse mode optical output greatly increases.

As mentioned above, the technology disclosed in Japanese Patent Laid-open H10-56233, in principle, makes it possible to increase the output in fundamental transverse mode. However, it also has the disadvantage of adversely affecting the fundamental transverse mode characteristics and presenting difficulties in forming stably the loss-determining element 176 of prescribed shape.

In other words, the technology disclosed in Japanese Patent Laid-open H10-56233 utilizes the fact that, in VCSEL, the fundamental transverse mode oscillation occurs at the center of the optical waveguide (in the vicinity of the optical axis) and the high-order transverse mode oscillation occurs at a position away from the optical axis, thereby causing the reflectivity of the cavity to gradually decrease in going from the center to the periphery. That is, it causes the optical loss to increase gradually and thereby suppresses the laser oscillation in high-order transverse mode.

On the other hand, VCSEL is usually has a small active region, as explained in "Surface Emitting Laser" by K. Iga and F. Koyama, issued by Ohm-sha, 1990. Therefore, it requires that the cavity have a high reflectance. In fact, the cavity for VCSEL under study today has a reflectance greater than 99%. Conversely, if the reflectance of the cavity is low, the threshold current density increases, making it difficult for laser oscillation to take place.

As matter of fact, the VCSEL disclosed in Japanese Patent Laid-open H10-56233 is constructed such that the reflectance of the cavity decreases at a position only slightly away from the optical axis 179. This suppresses not only the laser oscillation of the high-order transverse mode but also the laser oscillation of the fundamental transverse mode. As the result, this VCSEL does not provide a sufficiently high luminance fundamental transverse mode optical output.

In addition, the VCSEL disclosed in Japanese Patent Laid-open No. 56233/1998 is characterized by that the loss-determining element 176 has a curved surface (either concave or convex) as shown in FIG. 17. Thus the process for shaping the loss-determining element 176 is important, and it is detailed in Japanese Patent Laid-open H10-56233.

An example of the process is explained below. First, a photoresist 182 is applied to the surface of the layer 181 to be shaped convex, as shown in FIG. 18(*a*). The photoresist 182 is made into a cylindrical photoresist column 183, as shown in FIG. 18(*b*), by ordinary steps of exposure, development, and baking. The photoresist column 183 is heated at about 250–300° C. for about 5–20 minutes, so that it deforms into a layer 184 with a convex surface, as shown in FIG. 18(*c*). The layer 184 retains the convex shape even after it has been cooled to room temperature.

Then, dry etching is carried out with a reactive ion etchant (RIE). During dry etching, the layer 184 functions as an etching mask, thereby causing the structure 185 with a convex surface to be formed, as shown in FIG. 18(*d*).

The above-mentioned process for forming the structure with a convex surface may be modified such that the photoresist column 183 is formed near the periphery in place of the center on the layer 181. In this way it is possible to form a structure having a concave surface at the center on the layer 181.

Although the layer 184 functioning as an etching mask should be formed with a prescribed curved surface at a prescribed position, it is considerably difficult to form the curved surface at any position with good reproducibility even with the present-day etching technology. This problem is serious particularly in the case where a large number of VCSEL elements are arranged in a two-dimensional array.

Moreover, forming the loss-determining element 176 with a specific curved shape and a specific thickness presents serious difficulties in terminating the etching at a proper position at the time of or after the time of disappearance of the layer 184 which has functioned as the etching mask in the RIE step.

In the case where a large number of VCSEL elements are arranged in a two-dimensional array, it is very difficult to accurately control the etching selectivity between the materials constituting the photoresist column 183 and the loss-determining element 176 on a single substrate or on two or more substrates. This in turn presents another serious difficulties in producing VCSEL elements which are uniform in the reflectance of the loss-determining element 176.

As mentioned above, it is very difficult to eliminate or minimize the variation in the shape and film thickness of loss-determining elements 176 among VCSEL elements on a single substrate or two or more than two substrates or among VCSEL elements of different lots.

On the other hand, the concave surface of the loss-determining element 176 causes the optical loss of the cavity to gradually increases with increasing distance from the optical axis 179, thereby increasing the injection current, preventing the shift to the laser oscillation of high-order transverse mode, and enabling the laser oscillation of fundamental transverse mode. Therefore, if the shape of the concave surface of the loss-determining element 176 differs, the optical output of VCSEL at which the shifting to the laser oscillation of high-order transverse mode occurs differs accordingly (or the maximum optical output of the fundamental transverse mode differs accordingly). As the result, the maximum optical output of the fundamental transverse mode varies among VCSEL elements on a single substrate or two or more than two substrates or among VCSEL elements of different lots. Thus it is industrially difficult to apply the technology disclosed in H10-56233 to applications which need the high-luminance optical output in fundamental transverse mode.

SUMMARY OF THE INVENTION

It is an object of the present invention to provide a surface emitting laser and a surface emitting laser array with a high luminance optical output in fundamental transverse mode almost uniform independently of positions, which can be produced easily with good reproducibility.

The present inventors carried out a series of researches which led to the finding that the above-mentioned problems can be solved by the following means.

The present invention covers a surface emitting laser of the type having an active layer region composed of an active layer and spacer layers deposited on both sides thereof and reflection layers deposited on both sides of the active layer region, which comprises a first mode control layer which is deposited at the periphery of the center of emission of the laser beam which has been evolved in the active layer region and also at the position where the laser beam is received before its emission and which reflects the laser beam toward the reflection layer, and a second mode control layer (transparent) into which comes the laser beam reflected by the reflection layers and the first mode control layer.

One embodiment of the present invention is a surface emitting laser of the type having an active layer region composed of an active layer and spacer layers deposited on both sides thereof and reflection layers deposited on both sides of the active layer region, which comprises a first mode control layer which is deposited at the periphery of the center of emission of the laser beam which has been evolved in the active layer region and also on the outside of at least one of the reflection layers and which reflects the laser beam toward at least one of the reflection layers, and a second mode control layer (transparent) which is deposited at least at the periphery of the center of emission of the laser beam which has been evolved in the active layer region and is deposited between at least one of the reflection layers and the first mode control layer and which lowers the reflectance for the wavelength of laser oscillation at the periphery of the center of laser emission.

Another embodiment of the present invention is a surface emitting laser of the type having an active layer region composed of an active layer and spacer layers deposited on both sides thereof and reflection layers deposited on both sides of the active layer region, which comprises a first mode control layer which is deposited at the periphery of the center of emission of the laser beam which has been evolved in the active layer region and also on the outside of at least one of the reflection layers and which reflects the laser beam toward at least one of the reflection layers, and a second mode control layer (transparent) which is deposited at least at the periphery of the center of emission of the laser beam which has been evolved in the active layer region and is deposited between at least one of the reflection layers and the first mode control layer and which lowers the effective refractive index for the wavelength of laser oscillation at the periphery of the center of laser emission.

Another embodiment of the present invention is a surface emitting laser of the type having an active layer region composed of an active layer and spacer layers deposited on both sides thereof and reflection layers deposited on both sides of the active layer region, which comprises a first mode control layer which is deposited at the periphery of the center of emission of the laser beam which has been evolved in the active layer region and also on the outside of at least one of the spacer layers and which reflects the laser beam toward at least one of the spacer layers, and a second mode control layer (transparent) which is deposited at least at the periphery of the center of emission of the laser beam which has been evolved in the active layer region and is deposited between at least one of the reflection layers and the first mode control layer and which lowers the reflectance for the wavelength of laser oscillation at the periphery of the center of laser emission.

Another embodiment of the present invention is a surface emitting laser of the type having an active layer region composed of an active layer and spacer layers deposited on both sides thereof and reflection layers deposited on both sides of the active layer region, which comprises a first mode control layer which is deposited at the periphery of the center of emission of the laser beam which has been evolved in the active layer region and also on the outside of at least one of the spacer layers and which reflects the laser beam toward at least one of the spacer layers, and a second mode control layer (transparent) which is deposited at least at the periphery of the center of emission of the laser beam which has been evolved in the active layer region and is deposited between at least one of the reflection layers and the first mode control layer and which lowers the effective refractive index for the wavelength of laser oscillation at the periphery of the center of laser emission.

According to the present invention, the surface emitting laser array is formed by arranging in an array a plurality of surface emitting layers of the present invention.

The surface emitting laser constructed as mentioned above selectively suppresses the laser oscillation in high-order transverse mode that secondarily occurs, thereby increasing the optical output in fundamental transverse mode, without impairing the characteristics of the laser oscillation in fundamental transverse mode. In addition, it is constructed such that the effective refractive index at the periphery of the emission center for the laser beam of the cavity is lower than that at the emission center for the laser beam of the cavity. This permits the refractive index waveguide to be formed in the laser cavity, thereby enabling the efficient laser oscillation in fundamental transverse mode. The above-mentioned structure permits the surface emitting laser with a high-luminance optical output in fundamental transverse mode to be produced economically in high yields by simple steps with good reproducibility.

BRIEF DESCRIPTION OF THE DRAWINGS

FIG. 1(*b*) is a graph showing the light intensity distribution in the case of laser oscillation in fundamental transverse mode. FIG. 1(*c*) is a graph showing the light intensity distribution in the case of laser oscillation in high-order transverse mode.

DESCRIPTION OF THE PREFERRED EMBODIMENTS

The present invention is based on the principle which is briefly explained below.

Figure 1A:
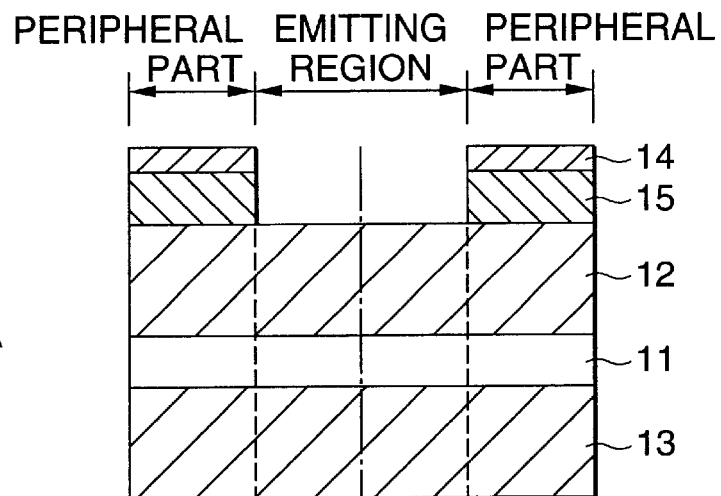
FIG. 1(*a*) is a schematic sectional view showing the structure of a VCSEL pertaining to the present invention.

FIG. 1(*a*) is a schematic sectional view showing the structure of the vertical cavity surface emitting laser (VCSEL) pertaining to the present invention. This VCSEL is composed of an active layer region 11 (composed of an active layer and upper and lower spacer layers deposited on both sides thereof), an upper reflection layer 12 deposited on the upper spacer layer of the active layer region 11 and a lower reflection layer 13 deposited on the lower spacer layer of the active layer region 11, and a first mode control layer 14 and a second mode control layer 15 which are formed in the periphery of the emission center of the laser beam on the upper reflection layer 12, with 12, 14, and 15 constituting the secondary cavity. The first mode control layer 14 is opaque and hence the emission region for the laser beam coincides with the region surrounded by the first mode control layer 14.

Incidentally, in this specification, the direction of the laser beam emission is designated as upward and its opposite direction is designated as downward for the sake of convenience. Therefore, "upper" and "lower" are merely relative.

The secondary cavity consists of an upper reflection layer 12, a first mode control layer 14, and a second mode control layer 15 (transparent) which is interposed between them. It is constructed such that the laser beam generated in the active layer region passes through the second mode control layer 15 and then is reflected by the first mode control layer 14 and reflected again by the upper reflection layer 12 opposite to the first mode control layer 14. Thus there occurs multiple reflection between the upper reflection layer 12 and the first mode control layer 14. The laser beam reflected by the upper reflection layer 12 enters the second mode control layer 15, with its phase changed, and the laser beam reflected by the first mode control layer 14 enters the second mode control layer 15, with its phase changed. The phase-changed laser beam interferes with the incident laser beam, thereby attenuating the associated wave and decreasing the reflectance. The phase change may change the oscillating wavelength in and near the emission region of the laser beam, and this produces the effect of optical confinement.

The second mode control layer 15 may have its optical thickness (in terms of the light velocity corrected by the permittivity of the material) so adjusted that the resonating wavelength in the secondary cavity equals the wavelength (say, 780 nm) of the laser oscillating in fundamental transverse mode. In this case, the reflectance of the secondary cavity in the vicinity of the oscillating wavelength of the laser beam decreases, with the result that the reflectance of the secondary cavity in the periphery of the laser emission region locally decreases.

Figure 1B:
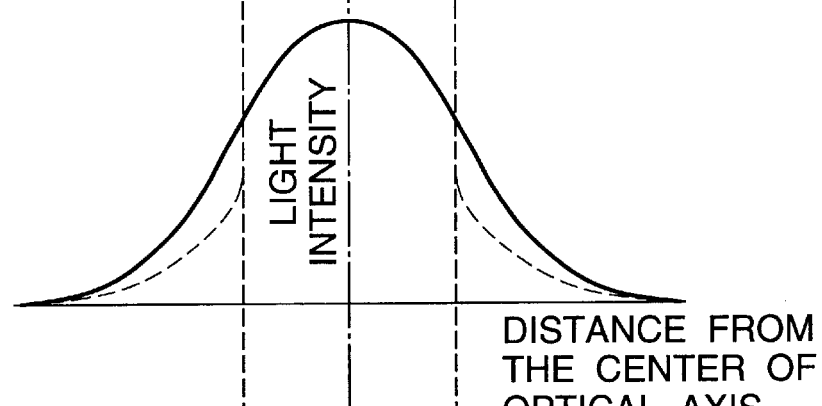
Figure 1C:
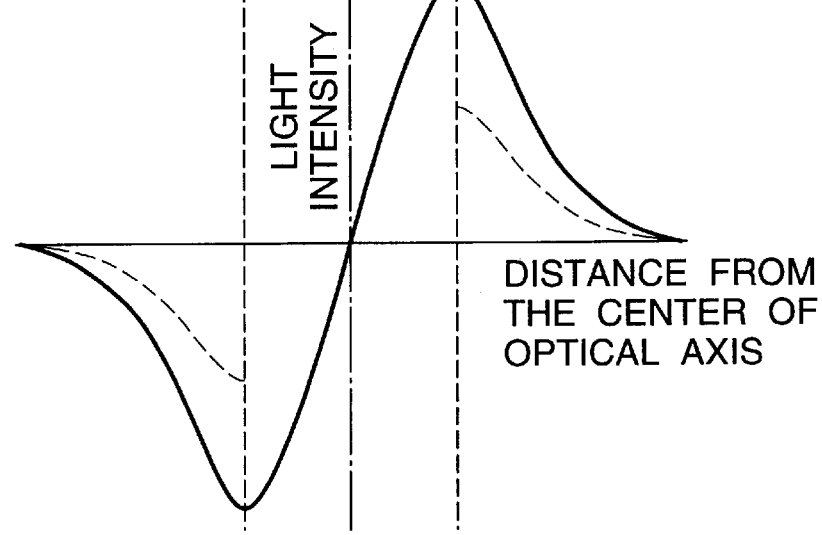
Figure 2:
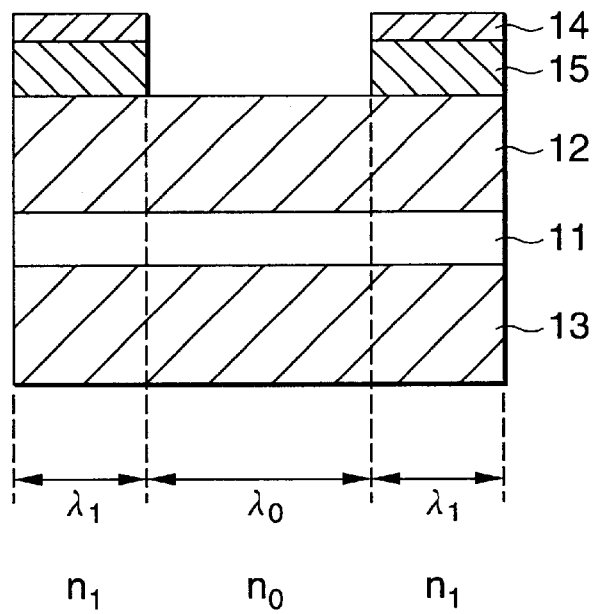
FIG. 2 is a sectional view of a VCSEL pertaining to the present invention which has the refractive index waveguide structure.

If the reflectance of the laser cavity decreases in the periphery of the layer emission region as mentioned above, the intensity of the laser beam oscillating in fundamental transverse mode decreases in the periphery (as indicated by the broken line in FIG. 1(b)) and the intensity of the laser beam oscillating in high-order transverse mode decreases in the periphery (as indicated by the broken line in FIG. 1(c)). As the result, the laser beam oscillating in fundamental transverse mode concentrates in the emission region, whereas the laser beam oscillating in high-order transverse mode concentrates in the periphery. Therefore, each time the laser beam is reflected by the upper reflection layer 12, the intensity of the laser beam oscillating in high-order transverse mode decreases more than the intensity of the laser beam oscillating in fundamental transverse mode.

The result of the foregoing is that it is necessary to inject a greater current into the active layer than in the case of conventional VCSEL without the secondary cavity, in order to attain the intensity necessary for the laser to oscillate in high-order transverse mode. This implies that the threshold value for laser oscillation in high-order mode has increased than before. In other words, the VCSEL of the present invention permits a greater current to be injected into the active layer than the conventional one, while sufficiently suppressing the laser oscillation in high-order transverse mode. Thus the present invention provides a high-luminance surface emitting laser which oscillates only in fundamental transverse mode and has a high optical output of laser in fundamental transverse mode even when an injection current is increased more than before.

Incidentally, the solid line in FIG. 1(b) indicates the intensity of laser oscillating in fundamental transverse mode in the case where the secondary cavity is not provided. The solid line in FIG. 1(c) indicates the intensity of laser oscillating in high-order transverse mode in the case where the secondary cavity is not provided.

It is not always necessary that the wavelength resonating in the secondary cavity coincide with the oscillating wavelength of the laser beam. Any wavelength is acceptable so long as the reflectance of the laser cavity decreases at the periphery of the emission center of the laser beam such that the laser oscillation in high-order transverse mode is sufficiently suppressed but the laser oscillation in fundamental transverse mode is not excessively suppressed.

If the optical thickness of the second mode control layer 15 is properly controlled such that the resonating wavelength in the secondary cavity is shifted toward the shorter side of the oscillating wavelength (say, 780 nm) of the laser beam, then the effective refractive index in the laser emission region can be made smaller than that in the periphery of the laser emission region. In this way it is possible to form the refractive index waveguide structure.

As disclosed by Hadley in Optics Letters vol. 20, pp. 1483–1485 (1997), it is known that as the resonance wavelength of the laser cavity shifts, the refractive index of the medium constituting the laser cavity effectively changes. According to him, the relation between the change ($\Delta\lambda$) in the resonance wavelength of the laser cavity and the effective change ($\Delta\lambda$) in the refractive index of the medium constituting the laser cavity is expressed by $\Delta\lambda/\lambda_0 = \Delta n/n_0$ (where $\lambda_0$ is the resonance wavelength of the laser cavity, and no is the average refractive index of the medium constituting the cavity.

In the case of the laser cavity having the secondary cavity as mentioned above, the resonance wavelength in the periphery of the emitting center for the laser beam (or in the region where the first mode control layer 14 and the second mode control layer 15 exist) shifts from $\lambda_0$ to $\lambda_1$, where $\lambda_0$ is resonance wavelength in the emitting region for the laser beam (or in the region where the first mode control layer 14 and the second mode control layer 15 do not exist).

The fact that the resonance wavelength varies from one region to another means that the effective refractive index of the laser cavity varies from the emission region of the laser beam to the periphery thereof, according to the relational expression given above. The refractive index is $n_0$ in the region where the first mode control layer 14 and the second mode control layer 15 do not exist, and the refractive is $n_1$ in the region where the first mode control layer 14 and the second mode control layer 15 exist. According as the optical thickness of the second mode control layer 15 is controlled, the resonance wavelength varies from one region to another. This makes it possible to control the effective refractive index for each region.

If the optical thickness of the second mode control layer 15 is selected such that the effective refractive index in the periphery of the laser emission region is smaller as compared with that in the laser emission region, by utilizing the above-mentioned characteristics, it is possible to form the refractive index waveguide structure.

In addition, if the optical thickness of the second mode control layer 15 is selected in consideration of the distribution of the optical electric field of fundamental transverse mode and high-order transverse mode in the refractive index waveguide, then it is possible to form the refractive index waveguide structure which has good characteristics of laser oscillation in fundamental transverse mode.

The foregoing is about the case in which the effective refractive index in the periphery of the emission region is reduced relative to that in the emission region. However, it is also possible to form the refractive index waveguide structure if the refractive index in the periphery of the emission region is increased rather than reduced. However, better characteristics will be obtained when both the refractive index and effective refractive index in the periphery are smaller than those in the emission region. In other words, if the effective refractive index in the emission region is made different from that in the periphery of the emission region by forming the secondary cavity, it is possible to form the optical confinement structure.

Incidentally, the above-mentioned VCSEL may be constructed such that the first mode control layer 14 is made of a conductive material and it is used as the electrode. The construction in this way simplifies the layer structure.

The foregoing is about the case in which the laser emission region coincides with the region surrounded by the first mode control layer. If the first mode control layer is somewhat transparent, the laser may be emitted partly through the first mode control layer. Even in this case, the refractive index decreases and the effective refractive index changes in the portion where the first mode control layer exists, and hence the laser oscillation in fundamental transverse mode occurs. In other words, the present invention produces its effect if the first mode control layer is arranged at a position where it receives in the periphery of the center of the laser emission (the place where the laser beam intensity distribution is highest) the laser beam before the laser beam which has been generated in the active layer region is emitted out of the laser element.

Alternatively, the first mode control layer may be arranged such that the laser oscillation in fundamental transverse mode occurs, and it may be formed continuously or intermittently over the entire periphery of the emission center. For the laser beam generated in the active layer region to be efficiently reflected, the first mode control layer should preferably be at least partly arranged such that it overlaps the region into which the laser drive current to the active layer is injected, as viewed from the laser emission direction.

The second mode control layer should preferably be transparent to such an extent that the incident laser beams reflected by the reflection layer and the first mode control layer interfere with each other.

The First Embodiment

Figure 3:
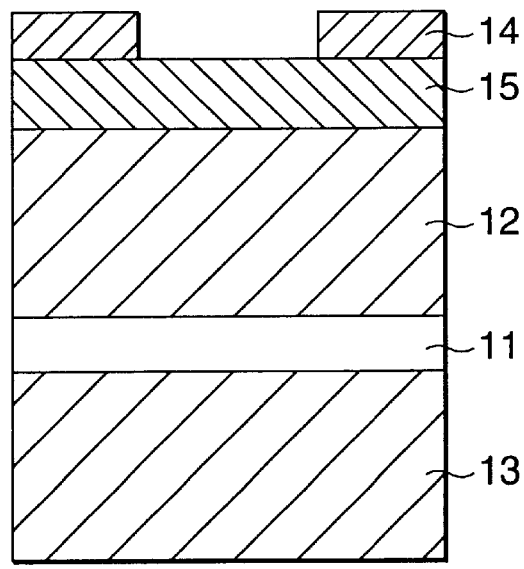
FIG. 3 is a sectional view of a VCSEL pertaining to the first embodiment of the present invention.

FIG. 3 is a sectional view of the vertical cavity surface emitting laser (VCSEL) pertaining to the first embodiment of the present invention.

This VCSEL is composed of an active layer region 11 (which is composed of an active layer and upper and lower spacer layers deposited on both sides thereof), an upper reflection layer 12 (which is deposited onto the upper spacer layer of the active layer region 11), a lower reflection layer 13 (which is deposited onto the lower spacer layer of the active layer region 11), and a secondary cavity (which is composed of the upper reflection layer 12, a first mode control layer 14 surrounding the center of laser emission, and a second mode control layer 15).

The active layer region 11 is composed of a lower spacer layer of undoped $Al_{0.5}Ga_{0.5}As$, an undoped quantum well active layer (composed of 3 quantum well layers, 90 nm thick, of $Al_{0.11}Ga_{0.89}As$ and 4 barrier layers, 50 nm thick, of $Al_{0.3}Ga_{0.7}As$), and an upper spacer layer of undoped $Al_{0.5}Ga_{0.5}As$. The optical thickness of the active layer region 11 determines the wavelength in the medium (for example, 780 nm).

The upper reflection layer 12 is a DBR (Distributed Bragg Reflector) composed of layers of $Al_{0.9}Ga_{0.1}As$ and $Al_{0.3}Ga_{0.7}As$ which are deposited alternately 20 periods such that each optical thickness is ¼ of the laser oscillating wavelength (say, 780 nm).

The second mode control layer 15 is formed over the entire surface of the upper reflection layer 12 (or the laser emission center and the periphery thereof). It is formed from $Al_{0.3}Ga_{0.7}As$ and has an optical thickness equal to from 1.55/4 to 1.62/4 times (preferably 1.6/4 times) the laser oscillating wavelength (say, 780 nm).

The first mode control layer 14 is a 200-nm thick film formed from gold on the second mode control layer 15 at the periphery of the center of laser emission. The first mode control layer 14 will fully suppress the oscillation in high-order transverse mode if it is thicker than about 100 nm.

The lower reflection layer 13 is a DBR (Distributed Bragg Reflector) composed of layers of $Al_{0.9}Ga_{0.1}As$ and $Al_{0.3}Ga_{0.7}As$ which are deposited alternately 40.5 periods such that each optical thickness is ¼ of the laser oscillating wavelength (say, 780 nm). Incidentally, the lower reflection layer 13 is formed on the substrate (not shown) with a buffer layer (not shown) interposed between them.

In this embodiment, the secondary cavity is composed of the upper reflection layer 12, the first mode control layer 14, and the second mode control layer 15 interposed between them. Between the upper reflection layer 12 and the first mode control layer 14 occurs the multiple reflection which changes the phase of the laser beam. The phase change brings about interference, which in turn reduces the reflectance at the periphery of the center of laser emission.

Figure 4:
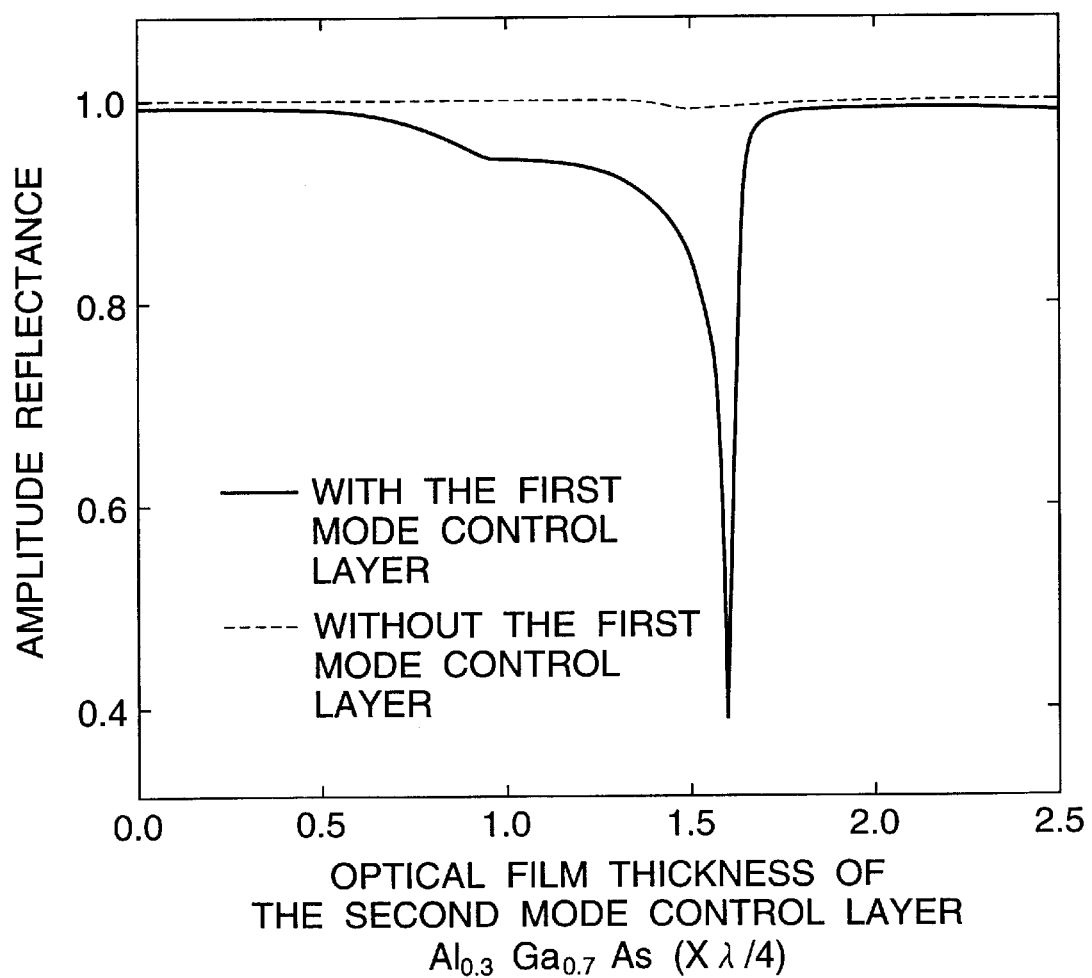
FIG. 4 is a graph showing the relation between the optical thickness of the second mode control layer and the amplitude reflectance at a laser oscillating wavelength of 780 nm.

FIG. 4 is a graph showing the relation between the optical thickness of the second mode control layer 15 and the amplitude reflectance at the laser oscillating wavelength of 780 nm. The solid line in FIG. 4 indicates the relation between the optical thickness of the second mode control layer 15 and the amplitude reflectance of the laser oscillating wavelength of 780 nm at the periphery of the laser emitting center. It is noted that the amplitude reflectance is minimal (0.385) when the optical thickness of the second mode control layer 15 is equal to about 1.6ׯ wavelength.

For comparison, an experiment was carried out with a VCSEL of the same structure as shown in FIG. 3 except for the first mode control layer 14 which is not formed. The broken line in FIG. 4 indicates the relation between the optical thickness of the second mode control layer 15 and the amplitude reflectance of the laser oscillating wavelength of 780 nm at the periphery of the laser emitting center. It is noted that the amplitude reflectance is high (about 0.992) even when the optical thickness of the second mode control layer 15 is equal to about 1.6ׯ wavelength.

Figure 5A:
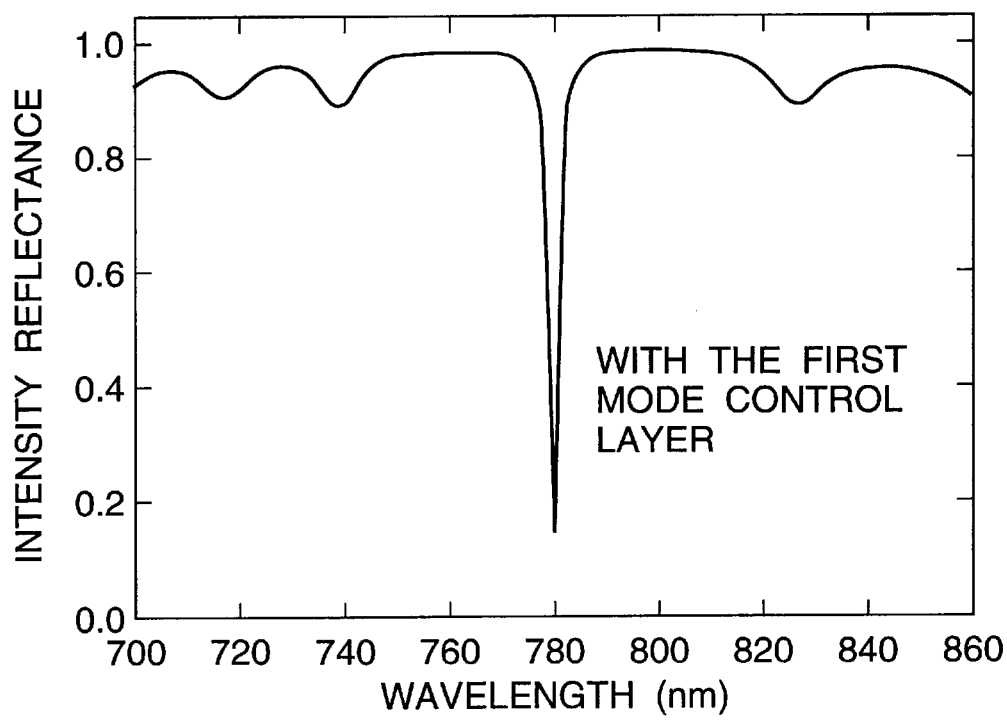
FIG. 5 is a graph showing the amplitude spectrum in the case where the optical thickness of the second mode control layer is equivalent to about 1.6×¼ wavelength. (a) represents that of the embodiment of the present invention, and (b) represents that of VCSEL without the first mode control layer.
Figure 5B:
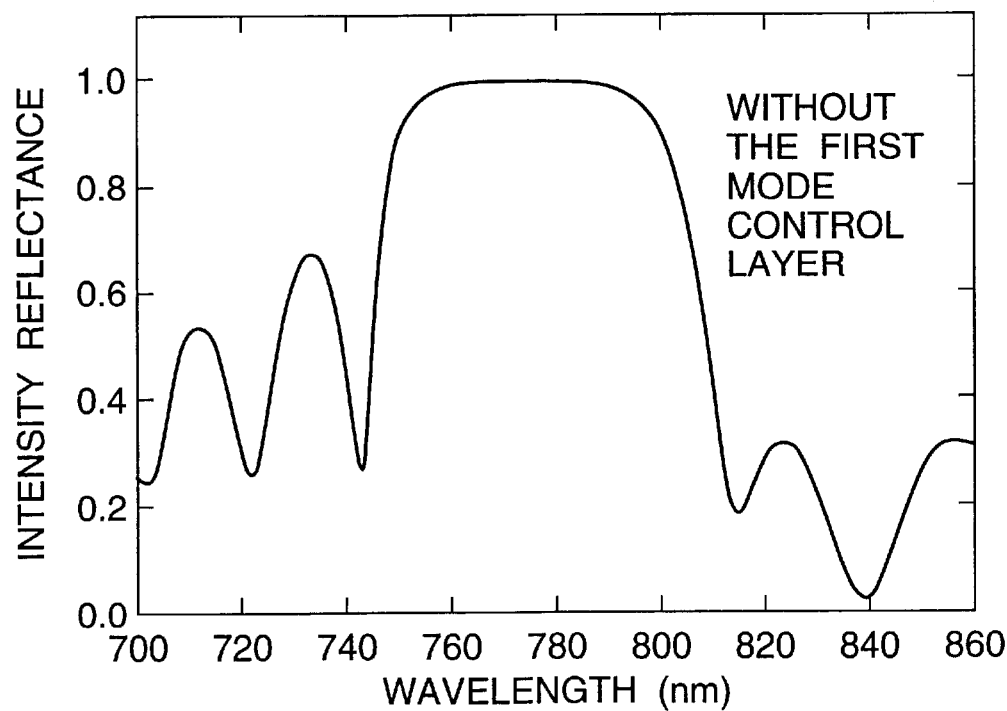

FIG. 5 is a graph showing the amplitude reflectance spectrum in the case where the optical thickness of the second mode control layer 15 is equal to about 1.6ׯ wavelength. FIG. 5(a) is the amplitude reflectance spectrum in the case where the first mode control layer 14 is formed, and FIG. 5(b) is the amplitude reflectance spectrum in the case when the first mode control layer 14 is not formed.

It is noted from FIG. 5(a) that the reflectance at about 780 nm decreases due to decrease in reflectance and/or effective refractive index by the secondary cavity. On the other hand, it is noted from FIG. 5(b) that the reflectance at about 780 nm remains high.

These characteristic properties enable the deposited structure of the second mode control layer 15 (which is formed on the entire surface (the emission center and the periphery thereof) of the upper reflection layer 12) and the first mode control layer 14 (which is formed on the periphery of the second mode control layer 15). This structure is easier to produce than the structure in which the second mode control layer 15 is formed only on the periphery of the upper reflection layer 12.

The optical thickness of the second mode control layer 15 may be controlled such that the resonating wavelength in the secondary cavity shifts from the laser oscillating wavelength (say, 780 nm) to the shorter side or the resonating wavelength at the laser emitting center shifts to the longer side. The result is that the effective refractive index at the periphery of the laser emitting center is made smaller than that at the laser emitting center. This makes it possible to produce the refractive index waveguide structure.

In addition, if the optical thickness of the second mode control layer 15 is selected in consideration of the distribution of the optical electric field of fundamental transverse mode and high-order transverse mode in the refractive index waveguide, then it is possible to form the refractive index waveguide structure which has good characteristics of laser oscillation in fundamental transverse mode.

The Second embodiment

Figure 6A:
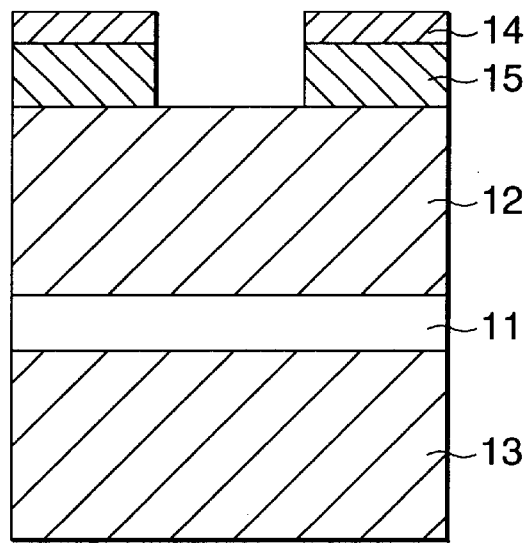
FIGS. 6(*a*) and 6(*b*) are sectional views of the VCSEL pertaining to the second embodiment of the present invention.
Figure 6B:
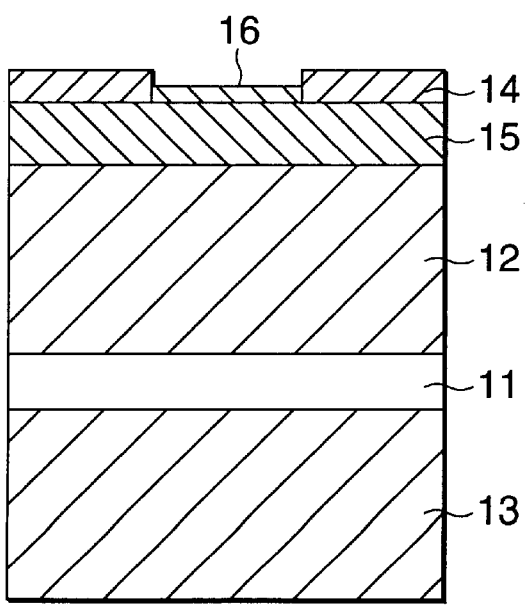

FIGS. 6(a) and 6(b) are sectional views of the vertical cavity surface emitting laser (VCSEL) pertaining to the second embodiment of the present invention.

The VCSEL shown in FIG. 6(a) has the same structure as that shown in FIG. 3 except that the second mode control layer 15 (which is deposited onto the upper reflection layer 12) has its central part (coinciding with the center of laser emission) removed.

The VCSEL shown in FIG. 6(b) has the same structure as that shown in FIG. 3 except that a reflection characteristics correcting layer 16 is deposited on the second mode control layer 15. This correcting layer 16 coincides with the center of laser emission and is designed to increase the reflectance for the laser beam having an oscillating wavelength of, say, 780 nm. The reflection characteristics correcting layer 16 may be formed from a dielectric material such as silicon dioxide.

The embodiments shown in FIGS. 6(a) and 6(b) are designed to improve the reflection characteristics so that the reflectance at the center of laser emission increases.

Figure 7A:
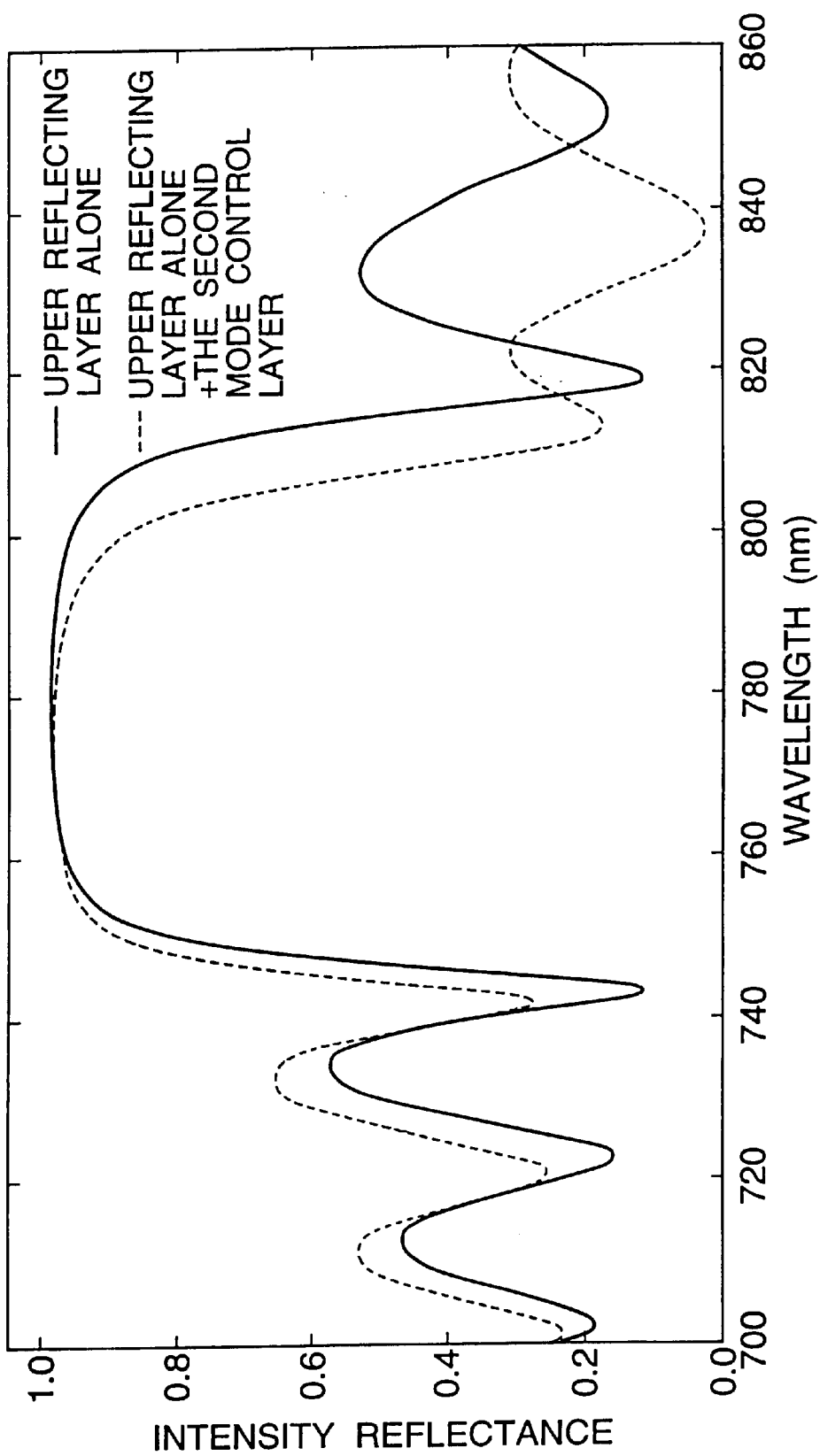
FIG. 7 is a graph showing the amplitude reflectance spectrum of the upper reflecting layer.
Figure 7B:
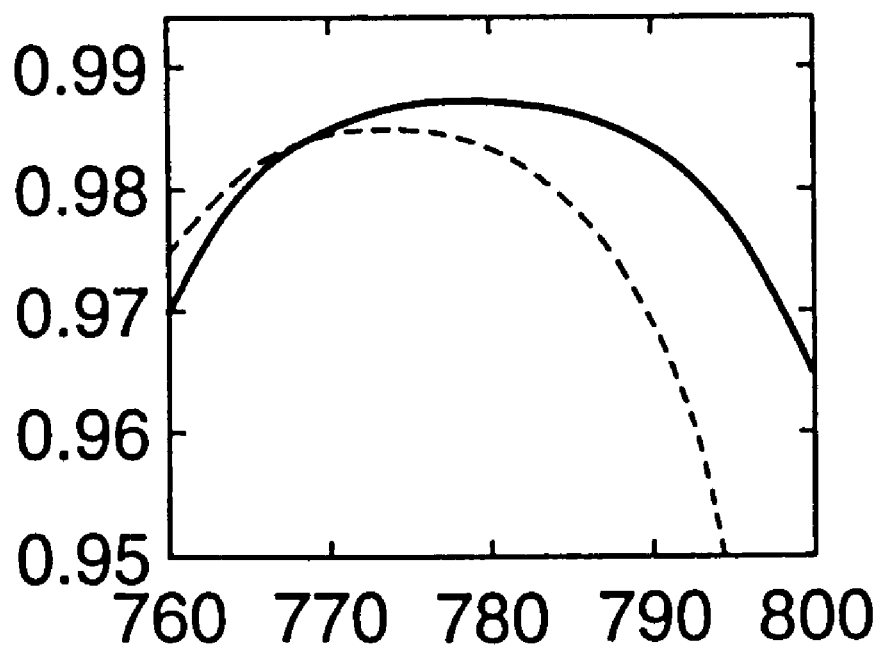

FIG. 7 is a graph showing the amplitude reflectance spectrum of the upper reflection layer 12. The solid line in FIG. 7 indicates the amplitude reflectance of the upper reflection layer 12 in the embodiments shown in FIG. 6(a) and 6(b) which lack the first mode control layer 14 and the second mode control layer 15. The broken line in FIG. 7 indicates the amplitude reflectance of the upper reflection layer 12 in the embodiment shown in FIG. 6(b) which lacks the first mode control layer 14 and the reflection characteristics correcting layer 16. This spectrum diagram corresponds to that shown in FIG. 5(b). The inset in FIG. 7 is an enlarged diagram showing the amplitude reflection spectrum at the laser oscillating wavelength of about 780 nm.

It is noted from FIG. 7 that the amplitude reflectance of the upper reflection layer 12 for the laser oscillating wavelength of about 780 nm is higher in the case where the second mode control layer 15 is not formed than in the case where the second mode control layer 15 is formed. This implies that the second mode control layer 15 impairs the reflection characteristics of the upper reflection layer 12.

Therefore, the reflectance of the upper reflection layer 12 at the center of laser emission increases if the second mode control layer 15 has its central part (coinciding with the center of laser emission) removed.

In addition, as shown in FIG. 6(b), the reflectance of the upper reflection layer 12 at the center of laser emission increases if the reflection characteristics correcting layer 16 is additionally formed on the second mode control layer 15 at the center of laser emission.

The optical thickness of the second mode control layer 15 may be controlled such that the resonating wavelength in the secondary cavity shifts from the laser oscillating wavelength (say, 780 nm) to the shorter side or the resonating wavelength at the laser emitting center shifts to the longer side. The result is that the effective refractive index at the periphery of the laser emitting center is made smaller than that at the laser emitting center. This makes it possible to produce the refractive index waveguide structure.

In addition, if the optical thickness of the second mode control layer 15 is selected in consideration of the distribution of the optical electric field of fundamental transverse mode and high-order transverse mode in the refractive index waveguide, then it is possible to form the refractive index waveguide structure which has good characteristics of laser oscillation in fundamental transverse mode.

The Third Embodiment

Figure 8:
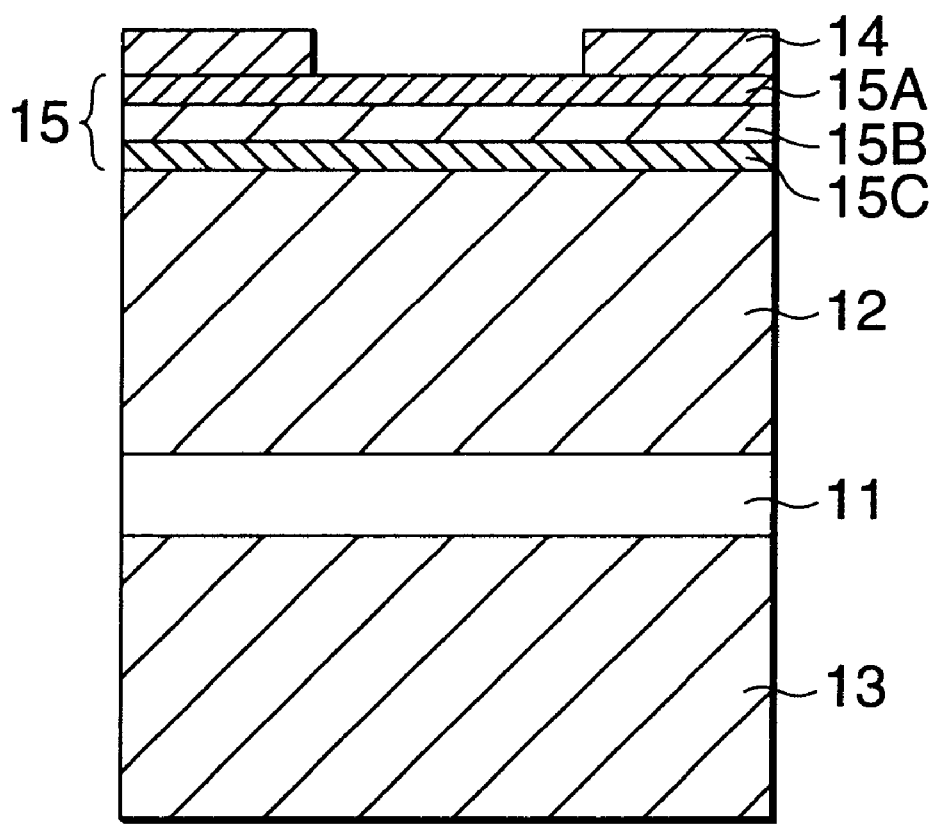
FIG. 8 is a sectional view of the VCSEL pertaining to the third embodiment of the present invention.

FIG. 8 is a sectional view of the vertical cavity surface emitting laser (VCSEL) pertaining to the first embodiment of the present invention.

This VCSEL has the same structure as that shown in FIG. 3 except that the second mode control layer 15 is composed of a plurality of layers instead of a single material and the first mode control layer 14 functions also as an electrode.

The first mode control layer 14 is 200 nm thick and is made of gold, so that it functions as one electrode for current injection into the VCSEL.

The second mode control layer 15 is composed of a 20-nm thick GaAs contact layer 15A (to ensure good electrical contact between the semiconductor layer and the first mode control layer 14 which functions also as an electrode), an $Al_{0.3}Ga_{0.7}As$ layer 15B (whose optical thickness corresponds to about 44×¼ laser oscillating wavelength, say, 780 nm), and an $Al_{0.9}Ga_{0.1}As$ layer 15C (whose optical thickness corresponds to about ¼ laser oscillating wavelength, say, 780 nm).

The fact that the second mode control layer 15 is composed of the contact layer 15A, the $Al_{0.3}Ga_{0.7}As$ layer 15B, and the $Al_{0.9}Ga_{0.1}As$ layer 15C offers the advantage that good electrical contact is ensured with the first mode control layer 14 which functions also as an electrode and the amplitude reflectance for the laser oscillating wavelength of 780 nm is about 0.705 at the periphery of the center of laser emission and about 0.993 at the center of laser emission, which leads to high luminance laser output in fundamental transverse mode.

As mentioned above, the second mode control layer 15 may be either of a single-layer structure made of a single material or of a multiple-layer structure made of a plurality of materials, so long as it constitutes the secondary cavity that adequately suppresses the laser oscillation in high-order transverse mode.

The optical thickness of the second mode control layer 15 may be controlled such that the resonating wavelength in the secondary cavity shifts from the laser oscillating wavelength (say, 780 nm) to the shorter side or the resonating wavelength at the laser emitting center shifts to the longer side. The result is that the effective refractive index at the periphery of the laser emitting center is made smaller than that at the laser emitting center. This makes it possible to produce the refractive index waveguide structure.

In addition, if the optical thickness of the second mode control layer 15 is selected in consideration of the distribution of the optical electric field of fundamental transverse mode and high-order transverse mode in the refractive index waveguide, then it is possible to form the refractive index waveguide structure which has good characteristics of laser oscillation in fundamental transverse mode.

The Fourth Embodiment

The VCSEL of the present invention may be constructed such that a second mode control layer (whose optical thickness is ¼ wavelength in the medium) is formed at a part of the periphery of the center of laser emission in the upper DBR layer and a first mode control layer is formed between the second mode control layer and the spacer layer of the active layer region. (This will be detailed later.)

The structure mentioned above lowers the reflectance and/or effective refractive index of the laser cavity at that specific part owing to the second mode control layer in the upper DBR layer and the first mode control layer interposed between the active layer region and the spacer layer.

However, if the second mode control layer is formed immediately over the spacer layer of the active layer region, the resulting structure does not lower the reflectance and/or effective refractive index of the laser cavity at that specific part.

An alternative structure is such that a part of the upper DBR layer functions also as the first mode control layer.

The Fifth Embodiment

A plurality of VCSELs of the present invention may be arranged in an array on a single substrate or two or more substrates. (A detailed description will be given later.)

The embodiments of the present invention have been explained so far. However, they may be modified in several ways. For example, the second mode control layer 15 may be formed from any conductive material (if it functions as a passage for current to be injected into the active layer) or from any semiconductor or dielectric material (if it does not function as a passage for current to be injected into the active layer).

Also, the first mode control layer 14 may be formed from any conductive material, such as gold, (if it functions also as an electrode) or from any semiconductor or dielectric material (if it does not function as an electrode). Moreover, it may be of a single layer structure or a multiple layer structure made of several materials.

In addition, the reflection characteristics correcting layer 16 may be formed from any dielectric material, semiconductor, and metal other than silicon dioxide.

EXAMPLES

The invention will be described in more detail with reference to the following examples.

Example 1

This example corresponds to the first embodiment shown in FIG. 3.

In this example, a VCSEL is produced in the following manner. On an n-type GaAs substrate 91 is formed by organometallic vapor phase epitaxy (MOCVD) an n-type GaAs buffer layer 92 which has a carrier density of $1\times10^{18}$ cm$^{-3}$ and a film thickness of about 0.2 μm, as shown in FIG. 9(*a*).

On this buffer layer 92 is formed by MOCVD a lower n-type DBR layer 93 which is composed of $Al_{0.9}Ga_{0.1}As$ layers and $Al_{0.3}Ga_{0.7}As$ layers deposited alternately 40.5 periods (such that each layer has an optical thickness corresponding to ¼ of the wavelength in the medium). The DBR layer 93 has a carrier density of $1\times10^{18}$ cm$^{-3}$ and a total thickness of about 4 μm.

On this lower n-type DBR layer 93 is formed by MOCVD an active layer region 94 which is composed of an undoped lower spacer layer of $Al_{0.5}Ga_{0.5}As$, an undoped quantum well active layer, and an undoped upper spacer layer of $Al_{0.5}Ga_{0.5}As$. The undoped quantum well active layer is composed of three quantum well layers of $Al_{0.11}Ga_{0.89}As$ with a film thickness of 90 nm and four barrier layers of $Al_{0.3}Ga_{0.7}As$ with a film thickness of 50 nm. The active layer region 94 has an optical thickness which is equivalent to the wavelength in the medium.

On this active layer region 94 is formed by MOCVD an upper p-type DBR layer 95 which is composed of $Al_{0.9}Ga_{0.1}As$ layers and $Al_{0.3}Ga_{0.7}As$ layers deposited alternately 20 periods (such that each layer has an optical thickness corresponding to ¼ of the wavelength in the medium). The DBR layer 95 has a carrier density of $1\times10^{18}$ cm$^{-3}$ and a total thickness of about 2 μm.

On this upper p-type DBR layer 95 is formed a second mode control layer 96 of p-type $Al_{0.3}Ga_{0.7}As$ which has a carrier density of $1\times10^{18}$ cm$^{-3}$ and an optical thickness corresponding to from 1.55/4 to 1.62/4 (preferably 1.6/4) of the wavelength in the medium.

On the second mode control layer 96 is formed an optional p-type GaAs contact layer (not shown) which has a carrier density of $1\times10^{19}$ cm$^{-3}$ and an optical thickness of about 10 nm.

In addition, an optional region with an optical thickness of about 9 nm in which the AlAs composition changes stepwise from 90% to 30% may be formed at the interface between $Al_{0.9}Ga_{0.1}As$ and $Al_{0.3}Ga_{0.7}As$ so as to decrease the electrical resistance of the DBR layers 93 and 95. (No details are given.)

MOCVD is carried out continuously by using trimethyl gallium, trimethyl aluminum, and arsine (as raw material gases which are switched sequentially), cyclopentadinium magnesium (as a p-type dopant), and silane (as an n-type dopant). The substrate is kept at 750° C. during film forming.

On the top of the layer is formed by photolithography a resist mask R as shown in FIG. 9(*b*). Reactive ion etching with carbon tetrachloride (as an etchant) is carried out until etching reaches the middle of the lower n-type DBR layer 93, so as to form a cylindrical (or prismatic) post S with a diameter of about 10–30 μm. This part restricts the flow of electric current.

On the post S (with the resist mask R removed) is deposited an SiN layer 97 by plasma CVD, as shown in FIG. 9(*c*). That part of the SiN layer 97 which is on the top of the post S is removed by ordinary photolithography and etching with buffered hydrofluoric acid.

Figure 9A:
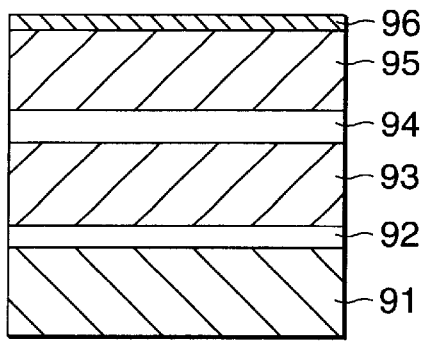
FIGS. 9(*a*) to 9(*e*) are sectional views sequentially showing the steps of producing the VCSEL in Example 1 of the present invention.
Figure 9B:
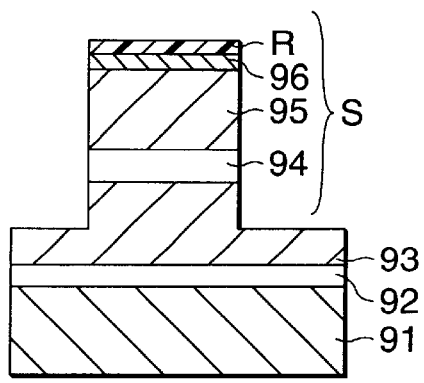
Figure 9C:
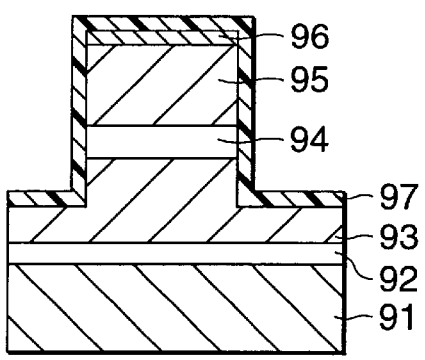
Figure 9D:
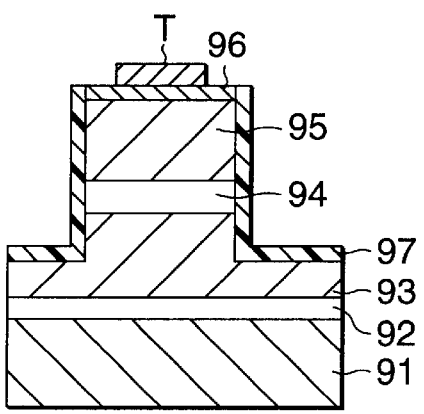

On the central part of the post S is formed a resist pattern T by photolithography, as shown in FIG. 9(d). Films of Ti and Au (with thicknesses of 10 nm and 200 nm, respectively) are formed by EB evaporation. These films constitute the first mode control layer which functions also as the p-side electrode.

Figure 9E:
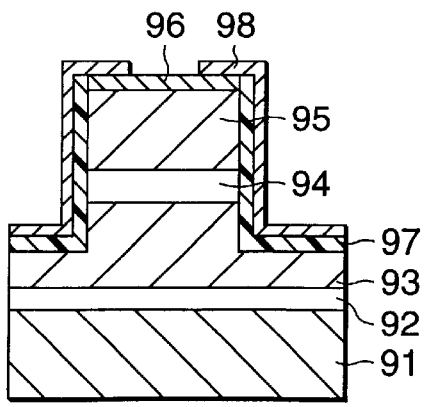

Finally, the resist pattern T is removed, together with the Ti and Au layers deposited thereon, by using acetone. In this way there is obtained the VCSEL, which is constructed, as shown in FIG. 9(e), such that the first mode control layer 98 (which functions also as the p-side electrode) is formed on the periphery of the center of laser emission in the second mode control layer 96.

This VCSEL emits the laser beam through the central part of the post S (which is the region where the second mode control layer 96 which functions also as the p-side electrode does not exist or the region where the resist pattern T existed). The region for emission should preferably have an opening of about 3–20 μm in diameter.

Incidentally, on the backside of the substrate 91 is an n-side electrode of AuGe formed by deposition (not shown).

The VCSEL produced as mentioned above is characterized in that the reflectance of the cavity is as high as about 99.5% (just below the center of laser emission at the center of the post S) and the reflectance of the cavity is low as in the case shown in FIG. 4 (just below the first mode control layer 98 which functions also as the p-side electrode). Therefore, it adequately suppresses the laser oscillation in high-order transverse mode. According to the conventional technology, it has been necessary that the opening of the laser emission region be smaller than 5 μm if the laser oscillation in fundamental transverse mode is to be obtained. However, according to the present invention, the VCSEL is capable of laser oscillation in fundamental transverse mode with high luminance even when the opening of the emission region is larger than 5 μm.

Figure 10:
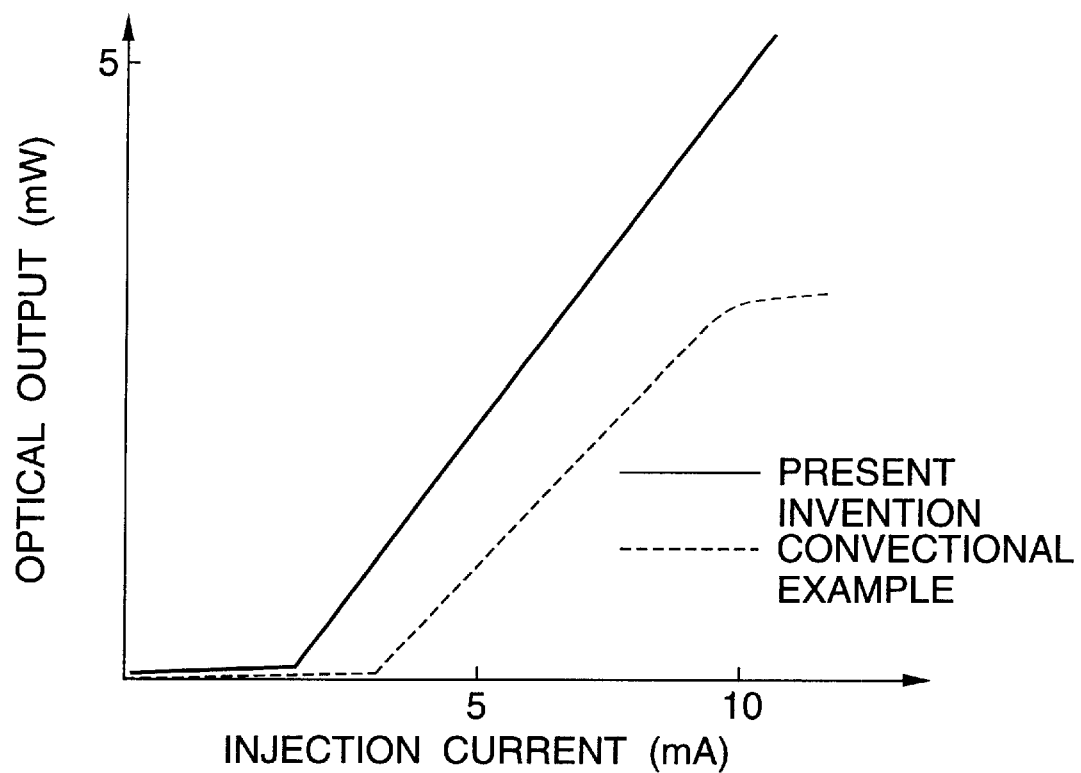
FIG. 10 is a graph showing the relation between the optical output and the injection current in the VCSEL pertaining to Example 1 of the present invention and the conventional VCSEL.
Figure 17:
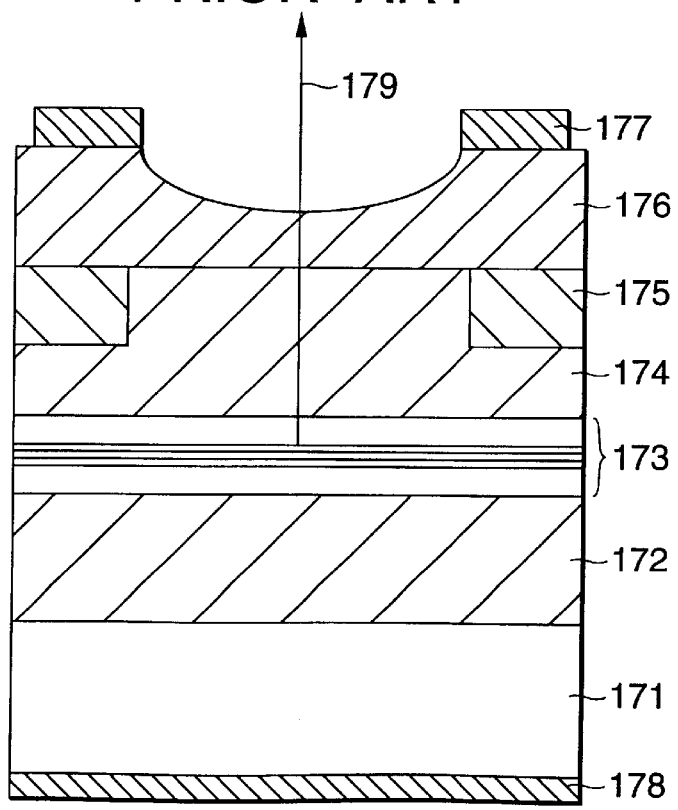
FIG. 17 is a sectional view of the conventional VCSEL with a concave loss determining element.
Figure 18A:
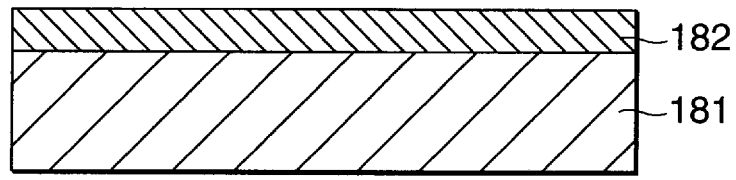
FIG. 18 is a sectional view sequentially showing the steps of producing the conventional VCSEL with a loss determining element.
Figure 18B:
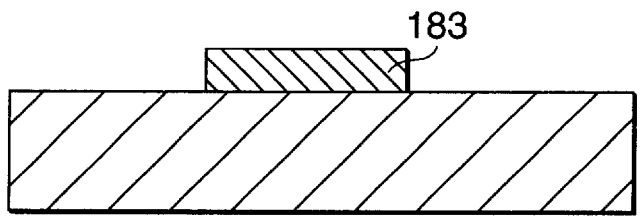
Figure 18C:
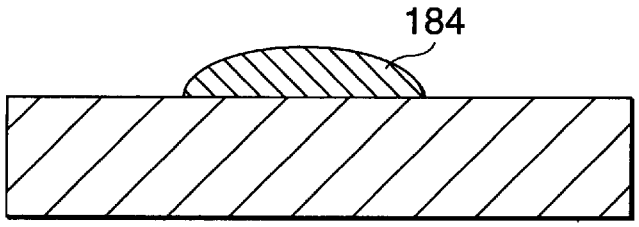
Figure 18D:
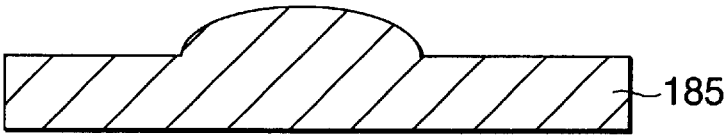

The VCSEL in Example 1 was examined for laser oscillation in fundamental transverse mode and laser oscillation in high-order transverse mode. The conventional VCSEL shown FIG. 17 was also examined for laser oscillation in fundamental transverse mode and laser oscillation in high-order transverse mode. The results are shown in FIG. 10. It is noted that in both VCSELs only the laser oscillation in fundamental transverse mode occurs and the laser oscillation in high-order mode is suppressed as the injection current into the active layer is increased. However, it is also noted that the conventional VCSEL is lower than the VCSEL of Example 1 in efficiency and the threshold value of current to start laser oscillation in fundamental transverse mode.

In Example 1, the second mode control layer 96 is formed from $Al_{0.3}Ga_{0.7}As$; however, it may be formed from any other materials so long as the resulting layer decreases the reflectance and/or effective refractive index of the laser cavity just under the first mode control layer 98. However, in the case where the second mode control layer 96 constitutes the passage for injection current as in Example 1, it should preferably be formed from a conductive material for easy current injection.

In Example 1, the post S is formed by etching to the middle of the lower n-type DBR layer 93; however, it may also be formed alternatively by etching to the upper spacer layer of $Al_{0.5}Ga_{0.5}As$ or a position above it or to a position just above the substrate 91.

In Example 1, the active layer is formed from AlGaAs but it may also be formed from GaAs or InGaAs (for emission of near infrared rays) or from InGaP or AlGaInP (for emission of red color) or from GaN or ZnSe (for emission of blue color and ultraviolet rays) or from InGaAsP (for emission of 1.3–1.5 μm band).

The DBR layers 93 and 95 may also be formed from any other insulating film than semiconductor material for various current injection systems. If the DBR layers 93 and 95 are formed from an insulating film, it is desirable to form the second mode control layer 96 also from an insulating film rather than semiconductor.

Example 2

This example corresponds to the second embodiment shown in FIG. 6(a).

Figure 11:
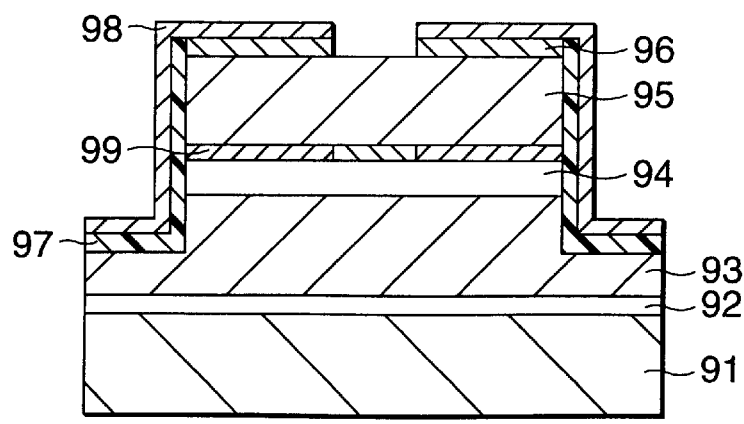
FIG. 11 is a sectional view of the VCSEL in Example 2 of the present invention.

In this example, a VCSEL is produced in the following manner. On an n-type GaAs substrate 91 is formed by MOCVD an n-type GaAs buffer layer 92 which has a carrier density of $1\times10^{18}$ cm$^{-3}$ and a film thickness of about 0.2 μm, as shown in FIG. 11.

On this buffer layer 92 is formed by MOCVD a lower n-type DBR layer 93 which is composed of $Al_{0.9}Ga_{0.1}As$ layers and $Al_{0.3}Ga_{0.7}As$ layers deposited alternately 40.5 periods (such that each layer has an optical thickness corresponding to ¼ of the wavelength in the medium). The DBR layer 93 has a carrier density of $1\times10^{18}$ cm$^{-3}$ and a total thickness of about 4 μm.

On this lower n-type DBR layer 93 is formed by MOCVD an active layer region 94 which is composed of an undoped lower spacer layer of $Al_{0.5}Ga_{0.5}As$, an undoped quantum well active layer, and an undoped upper spacer layer of $Al_{0.5}Ga_{0.5}As$. The undoped quantum well active layer is composed of three quantum well layers of $Al_{0.11}Ga_{0.89}As$ with a film thickness of 90 nm and four barrier layers of $Al_{0.3}Ga_{0.7}As$ with a film thickness of 50 nm. The active layer region 94 has an optical thickness which is equivalent to the wavelength in the medium.

On this active layer region 94 is formed by MOCVD a p-type AlAs layer 99 which has a carrier density of $1\times10^{18}$ cm$^{-3}$ and an optical thickness corresponding to ¼ of the wavelength in the medium.

On this p-type AlAs layer 99 is formed an upper p-type DBR layer 95 which is composed of $Al_{0.9}Ga_{0.1}As$ layers and $Al_{03}Ga_{0.7}As$ layers deposited alternately 19.5 periods (such that each layer has an optical thickness corresponding to ¼ of the wavelength in the medium). The DBR layer 95 has a carrier density of $1\times10^{18}$ cm$^{-3}$ and a total thickness of about 2 μm.

On this upper p-type DBR layer 95 is formed by MOCVD a second mode control layer 96 of p-type $In_{0.5}Ga_{0.5}P$ which has a carrier density of $1\times10^{18}$ cm$^{-3}$ and an optical thickness corresponding to from 1.55/4 to 1.62/4 (preferably 1.6/4) of the wavelength in the medium.

On the second mode control layer 96 is formed an optional p-type GaAs contact layer (not shown) which has a carrier density of $1\times10^{19}$ cm$^{-3}$ and an optical thickness of about 10 nm.

In addition, an optional region with an optical thickness of about 9 nm in which the AlAs composition changes stepwise from 90% to 30% may be formed at the interface between $Al_{0.9}Ga_{0.1}As$ and $Al_{0.3}Ga_{0.7}As$ so as to decrease the electrical resistance of the DBR layers 93 and 95. (No details are given.)

MOCVD is carried out continuously by using trimethyl gallium, trimethyl aluminum, trimethyl indium, arsine, and phosphine (as raw material gases which are switched sequentially, without breakage of vacuum), cyclopentadinium magnesium (as a p-type dopant), and silane (as an n-type dopant). The substrate is kept at 750° C. during film forming.

A cylindrical (or prismatic) post S with a diameter of about 30 μm is formed in the same manner as in Example 1. Then, only the AlAs layer 99 is oxidized sideward with water vapor in a furnace at about 400° C., so that a high-resistance part is formed. This part restricts the flow of electric current. The non-oxidized region, which has an inside diameter of about 3–20 μm, permits current injection into the active layer.

An SiN layer 97 (insulating layer) and a first mode control layer 98 (which functions also as p-side electrode) are formed in the same manner as in Example 1. That part of the second mode control layer 96 of $In_{0.5}Ga_{0.5}P$ (which corresponds to the upper central part of the post S) is removed by ordinary photolithography and wet etching with an etchant composed of phosphoric acid, hydrochloric acid, and water. Thus, there is obtained the desired VCSEL which has the first mode control layer 98 (which functions also as the p-side electrode) and the second mode control layer 96, which are formed on the periphery of the center of laser emission.

The VCSEL in Example 2 enables laser oscillation in fundamental transverse mode with high luminance, while suppressing laser oscillation in high-order mode, as explained in the section of the second embodiment.

In Example 2, that part of the second mode control layer 96 which coincides with the upper central part of the post S is removed. The same result may be produced by, instead of removing, forming a reflecting characteristics correcting layer on the second mode control layer 96 at the upper central part of the post S, as explained in the section of the second embodiment.

In Example 2, the second mode control layer 96 is formed from $In_{0.5}Ga_{0.5}P$ for easy selective etching. However, any other material may be used as in Example 1 so long as it decreases the reflectance and/or effective refractive index of the laser cavity at the periphery of the center of laser emission.

In Example 2, the active layer is formed from AlGaAs but it may also be formed from GaAs or InGaAs (for emission of near infrared rays) or from InGaP or AlGaInP (for emission of red color) or from GaN or ZnSe (for emission of blue color and ultraviolet rays) or from InGaAsP (for emission of 1.3–1.5 μm band), as in Example 1.

Example 3

This example corresponds to the third embodiment shown in FIG. 8.

Figure 12:
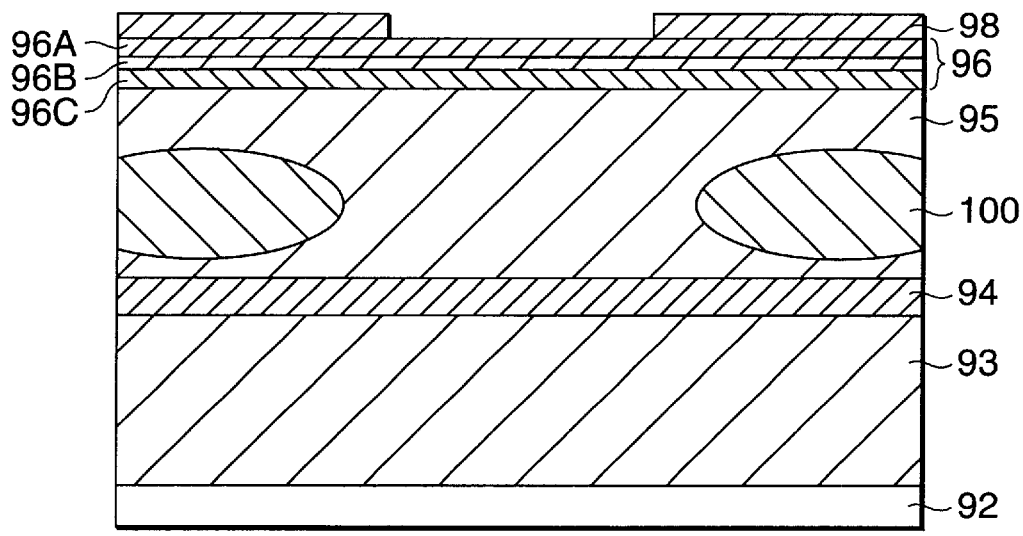
FIG. 12 is a sectional view of the VCSEL in Example 3 of the present invention.

In FIG. 12, there are shown an upper DBR layer 95 and a second mode control layer 96 composed of the following three layers formed thereon.

p-type $Al_{0.9}Ga_{0.1}As$ layer 96C having a carrier density of $1 \times 10^{18}$ cm$^{-3}$ and an optical thickness corresponding to ¼ of the wavelength in the medium.

p-type $Al_{0.3}Ga_{0.7}As$ layer 96B having a carrier density of $1 \times 10^{18}$ cm$^{-3}$ and an optical thickness corresponding to 0.44×¼ of the wavelength in the medium.

p-type GaAs contact layer 96A having a carrier density of $1 \times 10^{19}$ cm$^{-3}$ and an optical thickness of 20 nm.

In Example 3, the post S is not formed unlike Example 1. Instead, a high-resistance region 100 is formed by proton implantation in the side of the upper DBR layer 95. The region restricts the current flow.

At the periphery on the second mode control layer 96 is formed the first mode control layer 98 (which functions also as the p-side electrode) by deposition of Ti and Au, as in Example 1. The central opening of this first mode control layer 98 functions as the region for laser emission.

It is desirable that the center of the region of laser emission and the center of the proton-implanted part (for current restriction) coincides as much as possible with the optical axis of the laser beam.

The structure other than mentioned above is the same as that in Example 1, and hence its explanation is omitted.

The VCSEL prepared as mentioned above is characterized in that the cavity reflectance just under the center of laser emission at the central part is as high as about 99.5% and the cavity reflectance just under the first mode control layer 98 (which functions also as the p-side electrode) is as low as about 70%. This implies that it adequately suppresses the laser oscillation in high-order transverse mode.

That part of the second mode control layer 96 which is at the center of laser emission may be removed by etching, as in Example 2. Alternatively, a reflection characteristics correcting layer may be formed, instead of etching, on the second mode control layer 96 at the central part, as explained in the section of the second embodiment.

In Example 3, the active layer is formed from AlGaAs but it may also be formed from GaAs or InGaAs (for emission of near infrared rays) or from InGaP or AlGaInP (for emission of red color) or from GaN or ZnSe (for emission of blue color and ultraviolet rays) or from InGaAsP (for emission of 1.3–1.5 μm band), as in Example 1.

Example 4

Figure 13:
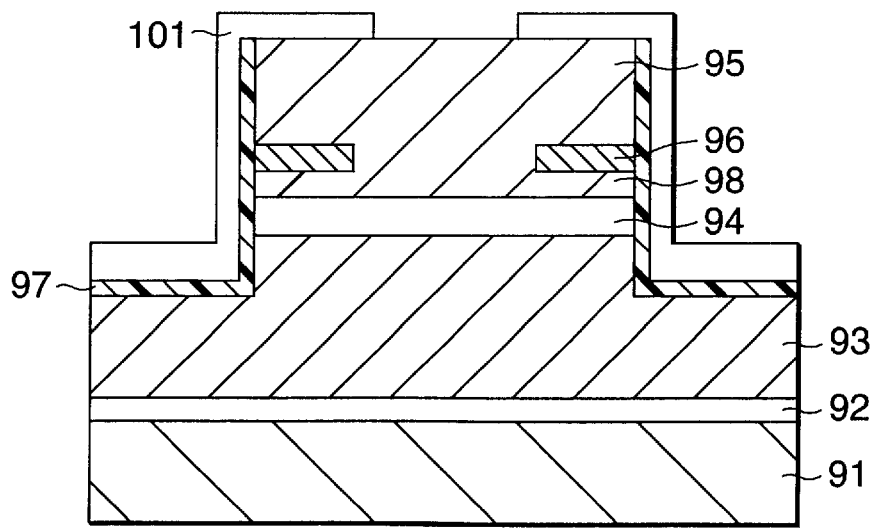
FIG. 13 is a sectional view of the VCSEL in Example 4 of the present invention.

On an n-type GaAs substrate 91 is formed by MOCVD an n-type GaAs buffer layer 92 which has a carrier density of $1 \times 10^{18}$ cm$^{-3}$ and a film thickness of about 0.2 μm, as shown in FIG. 13.

On this buffer layer 92 is formed by MOCVD a lower n-type DBR layer 93 which is composed of $Al_{0.9}Ga_{0.1}As$ layers and $Al_{0.3}Ga_{0.7}As$ layers deposited alternately 40.5 periods (such that each layer has an optical thickness corresponding to ¼ of the wavelength in the medium). The DBR layer 93 has a carrier density of $1 \times 10^{18}$ cm$^{-3}$ and a total thickness of about 4 μm.

On this lower n-type DBR layer 93 is formed by MOCVD an active layer region 94 which is composed of an undoped lower spacer layer of $Al_{0.5}Ga_{0.5}As$, an undoped quantum well active layer, and an undoped upper spacer layer of $Al_{0.5}Ga_{0.5}As$. The undoped quantum well active layer is composed of three quantum well layers of $Al_{0.11}Ga_{0.89}As$ with a film thickness of 90 nm and four barrier layers of $Al_{0.3}Ga_{0.7}As$ with a film thickness of 50 nm. The active layer region 94 has an optical thickness which is equivalent to the wavelength in the medium.

On this active layer region 94 is formed by MOCVD an upper p-type DBR layer 95 which is composed of $Al_{0.9}Ga_{0.1}As$ layers and $Al_{0.3}Ga_{0.7}As$ layers deposited alternately 20 periods (such that each layer has an optical thickness corresponding to ¼ of the wavelength in the medium). The DBR layer 95 has a carrier density of $1 \times 10^{18}$ cm$^{-3}$ and a total thickness of about 2 μm.

At a part of the periphery in this upper p-DBR layer 95 is formed an undoped second mode control layer 96 of $Al_{0.3}Ga_{0.7}As$ which has an optical thickness corresponding to ¼ of the wavelength in the medium. The second mode control layer 96 of $Al_{0.3}Ga_{0.7}As$ is formed at a position where $Al_{0.9}Ga_{0.1}As$ layers and $Al_{0.3}Ga_{0.7}As$ layers (which constitute a part of the upper p-type DBR layer 95 thereunder) are deposited alternately 5 periods.

In Example 4, the $Al_{0.9}Ga_{0.1}As$ and $Al_{0.3}Ga_{0.7}As$ layers deposited alternately 5 periods are placed between the second mode control layer 96 and the undoped upper $Al_{0.5}Ga_{0.5}As$ spacer layer of the active layer region 94, so that they function as the first mode control layer 98. In other words, owing to the $Al_{0.9}Ga_{0.1}As$ and $Al_{0.3}Ga_{0.7}As$ layers deposited alternately 5 periods (the first mode control layer 98), the second mode control layer 96 placed just over it, and the DBR layer 95, the reflectance and the effective refractive index of the laser cavity decrease at that part.

Incidentally, if the second mode control layer 96 is placed just over the undoped upper $Al_{0.5}Ga_{0.5}As$ spacer layer of the active layer region 94, the reflectance and the effective refractive index of the laser cavity do not decrease sufficiently at that part.

On the top is formed an optional p-type GaAs contact layer which has a carrier density of $1 \times 10^{19}$ cm$^{-3}$ and a film thickness of about 10 nm, although not shown.

In addition, an optional region with an optical thickness of about 9 nm in which the AlAs composition changes stepwise from 90% to 30% may be formed at the interface between $Al_{0.9}Ga_{0.1}As$ and $Al_{0.3}Ga_{0.7}As$ so as to decrease the electrical resistance of the DBR layers 93 and 95. (No details are given.)

In Example 4, like Example 1, etching is carried out to the middle of the lower n-type DBR layer 93 so as to form a cylindrical or prismatic post S having a diameter of 10–30 μm, which restricts the current flow.

An SiN layer 97 is deposited on the side and bottom of the post S.

On the top of the post S are deposited Ti and Au (10 nm and 300 nm thick, respectively) so as to form a p-side electrode 101, with its central part removed.

On the backside of the substrate 91 is formed by deposition an n-side electrode of AuGe (not shown). Laser beams are emitted through that part where the p-side electrode 101 does not exist or the laser emitting region at the central part of the post S. This region should preferably have an opening diameter of about 3–20 μm.

The VCSEL produced in Example 4 is characterized in that the reflectance of the cavity is as high as about 99.5% (just under the center of laser emission at the center of the post S) and the reflectance of the cavity is low as in the case shown in FIG. 4 (just under the second mode control layer 96), owing to the second mode control layer 96 of $Al_{0.3}Ga_{0.7}As$ inserted into the p-type DBR layer 95 and the $Al_{0.9}Ga_{0.1}As$ and $Al_{0.3}Ga_{0.7}As$ layers deposited 5 periods just under the second mode control layer 96 which functions as the first mode control layer. Therefore, it adequately suppresses the laser oscillation in high-order transverse mode.

In Example 4, the second mode control layer 96 is formed from $Al_{0.3}Ga_{0.7}As$; however, it may be formed from any other materials so long as the resulting layer decreases the reflectance and/or effective refractive index of the laser cavity just under the second mode control layer 96. Moreover, the undoped layer for the second mode control layer 96 may be replaced by an n-type or p-type layer. In the case where an undoped layer or an n-type layer is used, the second mode control layer 96 itself advantageously performs the function of current restriction. As in Example 1, the first mode control layer 98 may also be formed from any other material.

In Example 4, the post S is formed by etching to the middle of the lower n-type DBR layer 93; however, it may also be formed alternatively by etching to the upper spacer layer of $Al_{0.5}Ga_{0.5}As$ or a position above it or to a position just above the substrate 91.

In Example 4, the active layer is formed from AlGaAs but it may also be formed from GaAs or InGaAs (for emission of near infrared rays) or from InGaP or AlGaInP (for emission of red color) or from GaN or ZnSe (for emission of blue color and ultraviolet rays) or from InGaAsP (for emission of 1.3–1.5 μm band).

The DBR layers 93 and 95 may also be formed from any other insulating film than semiconductor material for various current injection systems. If the DBR layers 93 and 95 are formed from an insulating film, it is desirable to form the second mode control layer 96 also from an insulating film rather than semiconductor.

Figure 14:
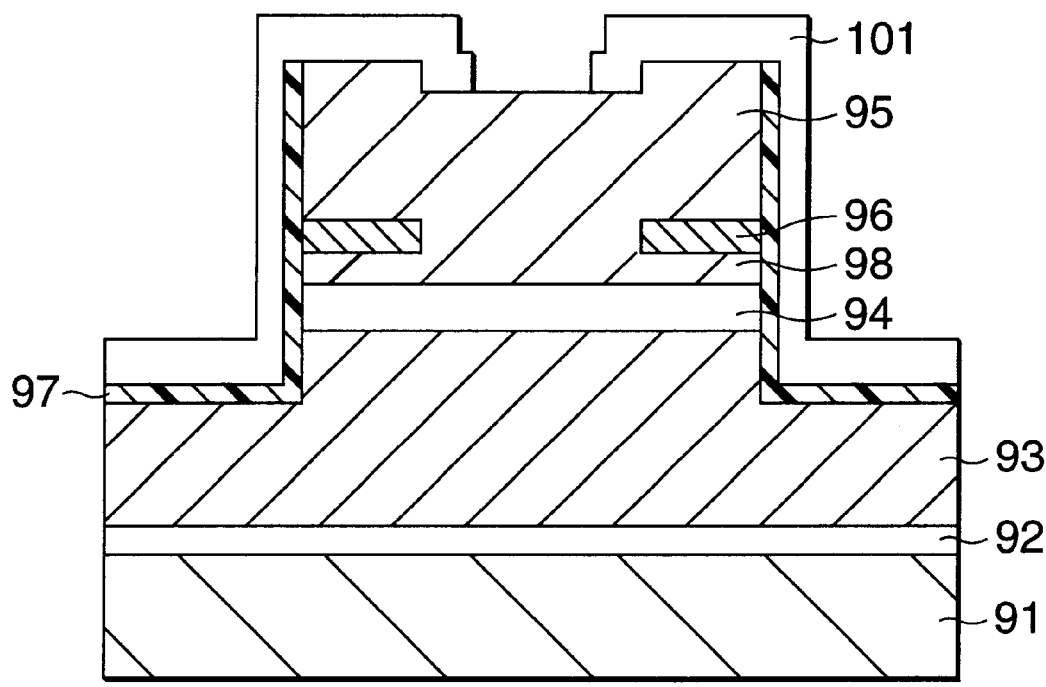
FIG. 14 is a sectional view of the VCSEL in Example 4 of the present invention.

Example 4 demonstrates a VCSEL in which the p-type DBR layer 95 has a flat top; however, surface irregularities may occur on the top of the p-type DBR 95, as shown in FIG. 14, when the second mode control layer 96 is formed by using the regrowing technology. The result is the same in this case, too.

Example 5

Figure 15:
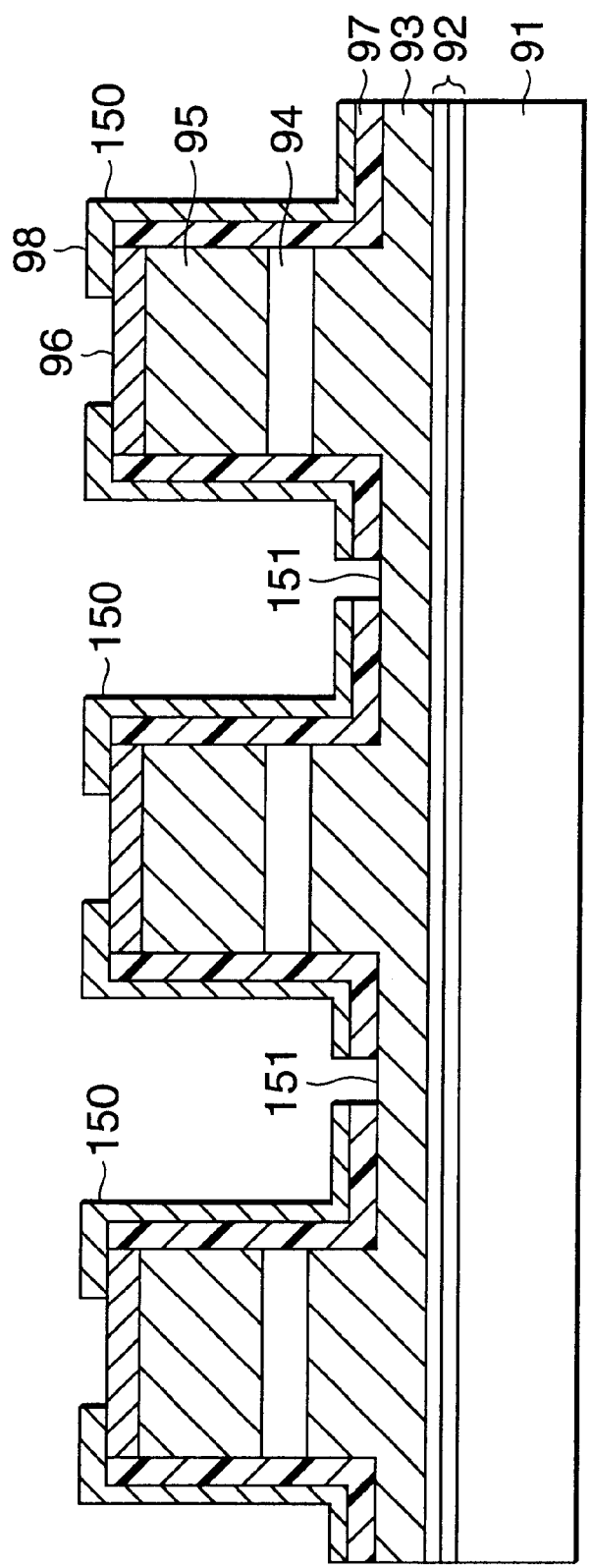
FIG. 15 is a sectional view of the VCSEL array in Example 5 of the present invention.
Figure 16:
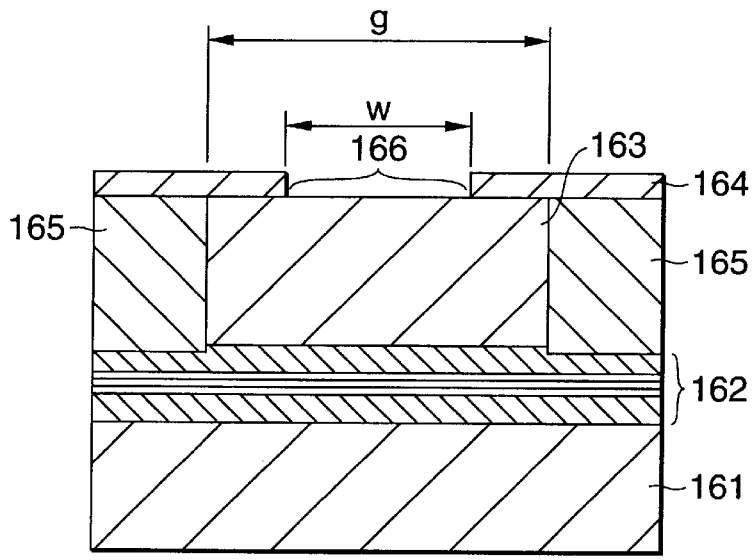
FIG. 16 is a sectional view of the conventional VCSEL of proton implantation type.

This example demonstrates a VCSEL array consisting of a plurality of VCSEL elements 150 (of the same structure as in Example 1) arranged on a single substrate, as shown in FIG. 15.

In Example 5, VCSEL elements 150 are electrically separated from one another by the grooves 151 which run horizontally and vertically. (FIG. 15 shows a cross section of the grooves running in one direction.)

The grooves 151 for electrical separation may be replaced by any other means, such as high-resistance regions formed by ion implantation.

The VCSEL elements 150 constituting the VCSEL array are of post type (shown in Example 1); however, they may be replaced by those of selective oxidation type (as shown in Example 2) or those of ion implantation type (as shown in Example 3).

Arrangement for the VCSEL array may be either two-dimensional or one-dimensional. Individual VCSEL elements may be activated by independent driving, matrix driving, or simultaneous driving.

Individual VCSEL elements 150 are formed by the technique which gives rise to a uniform film. This offers the advantage of minimizing variation in characteristic properties from one element to another even in the case of large-scale VCSEL array.

In the foregoing, Example 1 demonstrates the combination of the first embodiment with a VCSEL of post type, Example 2 demonstrates the combination of the second embodiment with a VCSEL with the current restricting structure formed by selective oxidation of AlAs, and Example 3 demonstrates the combination of the third embodiment with a VCSEL with the current restricting structure of proton implantation type. These combinations may be properly changed in achieving the object of the present invention. [Effect of the invention] As mentioned above, the present invention enables the production of a VCSEL and a VCSEL array having a high-luminance output in fundamental transverse mode, in high yields at a low price, with good reproducibility. The VCSEL and VCSEL array of the present invention will find use in application areas (such as printers and magneto-optical disk units) which need high-luminance output in fundamental transverse mode.

What is claimed is:

1. A surface emitting laser of the type having an active layer region composed of an active layer and spacer layers deposited on both sides thereof and reflection layers deposited on sides of the active layer region, which comprises a first mode control layer which is deposited at the periphery of the center of emission of the laser beam which has been evolved in the active layer region and also on the outside of at least one of the reflection layers and which reflects the laser beam toward at least one of the reflection layers, and a transparent second mode control layer separate from the first reflection layer which is deposited at least at the periphery of the center of emission of the laser beam which has been evolved in the active layer region and is deposited between at least one of the reflection layers and the first mode control layer, wherein the transparent second mode control layer has a laser beam phase changing property to change the phase of the laser beam reflected by at least one of the reflection layers and the first mode control layer into the transparent second mode control layer such that the laser beam reflected by the at least one of the reflection layers is attenuated with the laser beam reflected by the first mode control layer, wherein the reflection layers are Distributed Bragg Reflectors (DBR).

2. A surface emitting laser as defined in claim 1, wherein the second mode control layer has an optical thickness ¼ the laser oscillating wavelength.

3. A surface emitting laser as defined in claim 1, wherein the second mode control layer has an optical thickness from 1.55/4 to 1.62/4 times the laser oscillating wavelength.

4. A surface emitting laser array which comprises a plurality of surface emitting lasers as defined in claim 1 and arranged in an array.

5. A surface emitting laser as defined in claim 1, which has a current restricting structure of proton implantation type.

6. A surface emitting laser as defined in claim 1, wherein the transparent second mode control layer changes the phase of the laser beam reflected by at least one of the reflection layers and the first mode control layer and attenuates the synthetic wave of the laser beam which has its phase changed and the incident laser beam.

7. A surface emitting laser as defined in claim 1, wherein the transparent second mode control layer brings about interference by multiple reflection by the first mode control layer, the transparent second mode control layer, and the reflection layers, thereby decreasing the reflectance of the reflection layer.

8. A surface emitting laser as defined in claim 1, which has a current restricting structure of selective oxidation type.

9. A surface emitting laser as defined in claim 1, wherein the transparent second mode control layer changes the phase of the laser beam reflected by at least one of the reflection layers and the first mode control layer, such that the oscillating wavelength of the laser beam at the periphery of the center of emission of the laser beam differs from the oscillating wavelength of the laser beam at the center of emission of the laser beam.

10. A surface emitting laser as defined in claim 1, wherein the second mode control layer brings about interference by multiple reflection by the first mode control layer, the transparent second mode control layer, and the reflection layer, thereby decreasing the effective refractive index at the periphery of the center of emission of the laser beam.

11. A surface emitting laser as defined in claim 1, wherein the transparent second mode control layer shifts the wavelength resonating due to the first mode control layer, the transparent second mode control layer, and the reflection layer to the shorter side of the oscillating wavelength of the laser beam and also decreases the effective refractive index at the periphery of the center of emission of the laser beam.

12. A surface emitting laser as defined in claim 1, wherein the transparent second mode control layer has an optical thickness which varies from the center of emission of the laser beam, thereby increasing the reflectance for the oscillating wavelength of the laser beam at the center of emission of the laser beam.

13. A surface emitting laser as defined in claim 1, which further comprises a reflection characteristics correcting layer on at least one part of that part in the transparent second mode control layer which is positioned at the center of emission of the laser beam, the reflection characteristics correcting layer increasing the reflectance for the oscillating wavelength of the laser beam at the center of the emission of the laser beam.

14. A surface emitting laser as defined in claim 1, wherein the transparent second mode control layer is made of one or more materials or compositions.

15. A surface emitting laser as defined in claim 1, wherein the first mode control layer is made of one or more materials or compositions.

16. A surface emitting laser as defined in claim 1, wherein the first mode control layer is made of metal, so that it functions also as one of the electrodes.

17. A surface emitting laser as defined in claim 1, wherein the first mode control layer is composed of semiconductor multilayered films.

18. A surface emitting laser as defined in claim 1, wherein the first mode control layer is composed of dielectric multilayered films.

19. A surface emitting laser as defined in claim 1, which has a current restricting structure of post type.

20. A surface emitting laser of the type having an active layer region composed of an active layer and spacer layers deposited on both sides thereof and reflection layers deposited on sides of the active layer region, which comprises a first mode control layer which is deposited at the periphery of the center of emission of the laser beam which has been evolved in the active layer region and also on the outside of at least one of the spacer layers and which reflects the laser beam toward at least one of the spacer layers, and a transparent second mode control layer separate from the first reflection layer which is deposited only at the periphery of the center of emission of the laser beam which has been evolved in the active layer region and is deposited between at least one of the reflection layers and the first mode control layer, wherein the transparent second mode control layer has a laser beam phase changing property to change the phase of the laser beam reflected by at least one of the reflection layers and the first mode control layer into the transparent second mode control layer such that the laser beam reflected by the at least one of the reflection layers is attenuated with the laser beam reflected by the first mode control layer, wherein the reflection layers are Distributed Bragg Reflectors (DBR).

21. A surface emitting laser as defined in claim 20, wherein the first mode control layer is constructed such that it functions as a part of the reflection layer.

22. A surface emitting laser as defined in claim 20, wherein the transparent second mode control layer changes the phase of the laser beam reflected by at least one of the reflecting layers and the first mode control layer and attenuates the synthetic wave of the laser beam which has its phase changed and the incident laser beam.

23. A surface emitting laser as defined in claim 20, wherein the transparent second mode control layer changes the phase of the laser beam reflected by at least one of the reflection layers and the first mode control layer, such that the oscillating wavelength of the laser beam at the periphery of the center of emission of the laser beam differs from the oscillating wavelength of the laser beam at the center of emission of the laser beam.

24. A surface emitting laser as defined in claim 20, wherein the first mode control layer is constructed such that if functions as part of the reflecting layer.

25. A surface emitting laser as defined in claim 20, wherein the second mode control layer has an optical thickness from 1.55/4 to 1.62/4 times the laser oscillating wavelength.

26. A surface emitting laser as defined in claim 20, wherein the second mode control layer has an optical thickness ¼ the laser oscillating wavelength.

* * * * *